US012801798B2

(12) United States Patent
Anderson et al.

(10) Patent No.: US 12,801,798 B2
(45) Date of Patent: Nov. 17, 2026

(54) DUCT MODELING USING AN IMPROVED DUCT DEFINITION INTERFACE

(71) Applicant: THE BOEING COMPANY, Arlington, VA (US)

(72) Inventors: Anker Benjamin Anderson, Mill Creek, WA (US); Nicholas Alexander Jones, Lynnwood, WA (US); Adam Matthew Miller Jensen, Lynnwood, WA (US); Sibi Radhakrishnan, Everett, WA (US)

(73) Assignee: THE BOEING COMPANY, Arlington, VA (US)

( * ) Notice: Subject to any disclaimer, the term of this patent is extended or adjusted under 35 U.S.C. 154(b) by 881 days.

(21) Appl. No.: 18/184,058

(22) Filed: Mar. 15, 2023

(65) Prior Publication Data

US 2024/0311521 A1 Sep. 19, 2024

(51) Int. Cl.
*G06F 30/18* (2020.01)
*G06F 30/12* (2020.01)
*G06F 30/17* (2020.01)

(52) U.S. Cl.
CPC .............. *G06F 30/12* (2020.01); *G06F 30/17* (2020.01); *G06F 30/18* (2020.01)

(58) Field of Classification Search
CPC .......... G06F 30/12; G06F 30/18; G06F 30/17; G06F 2111/00; G06F 2119/22
See application file for complete search history.

(56) References Cited

U.S. PATENT DOCUMENTS

2007/0285424 A1* 12/2007 Cheng ..................... G06T 19/00 345/624
2008/0156569 A1 7/2008 Clevenger et al.
2012/0109588 A1* 5/2012 Bourgeois ............... G06F 30/00 703/1
2013/0132040 A1* 5/2013 Shook ..................... G06F 30/18 703/1
2018/0318899 A1* 11/2018 Byrd ........................ B21D 7/12
2023/0056634 A1 2/2023 Kerrigan et al.

FOREIGN PATENT DOCUMENTS

CN 104992034 A 10/2015

OTHER PUBLICATIONS

Extended European Search Report for application 24161404.9 dated Jul. 16, 2024, pp. 1-8.
Communication pursuant to Article 94(3) EPC for application No. 24161404.9 dated Jun. 5, 2024, pp. 1-5.
Communication pursuant to Article 94(3) EPC for application No. 24161404.9 dated Aug. 6, 2026, pp. 1-9.

* cited by examiner

*Primary Examiner* — Kibrom K Gebresilassie
(74) *Attorney, Agent, or Firm* — Moore IP Law

(57) ABSTRACT

Improved duct modeling using an improved duct definition interface includes receiving, from an automated duct definition interface, a plurality of duct definition parameters associated with a duct; in response to the receiving, building a duct definition database based at least on the plurality of duct definition parameters, the duct definition database further comprising a plurality of operational parameters associated with the duct; generating a duct model associated with the duct based at least on the duct definition database; and communicating the duct model to a duct modeling application for rendering.

20 Claims, 10 Drawing Sheets

DUCT MODELING USING AN IMPROVED DUCT DEFINITION INTERFACE

FIELD OF THE DISCLOSURE

The subject disclosure is generally related to improved duct modeling using an improved duct definition interface.

BACKGROUND

To improve the efficiency and efficacy of designing and building advanced machinery such as aircraft, designers increasingly rely on advanced tools and methods for modeling the various components of the advanced machinery to improve the manufacturing process.

The modeling processes for some components such as ductwork continue to heavily rely on a modeler's experience and engineering knowledge to be effective, even with advanced computer-based modeling. For example, some existing methods of creating a model-based definition ("MBD") for a duct include manually modeling duct assemblies, details, and features in a three-dimensional representation rendering engine. This engineering process can be tedious and time-consuming, leading to wide variations in model quality and accuracy.

One method of improving the effectiveness and efficiency of duct modeling systems is to improve the quality and accuracy of models before submitting the model to a rendering engine. In certain current duct modeling processes, there is no rigorous, automated method to improve the quality and accuracy of models.

SUMMARY

In a particular implementation, a method includes receiving, from an automated duct definition interface, a plurality of duct definition parameters associated with a duct. The method also includes, in response to the receiving, building a duct definition database based at least on the plurality of duct definition parameters, the duct definition database further comprising a plurality of operational parameters associated with the duct. The method also includes generating a duct model associated with the duct based at least on the duct definition database. The method also includes communicating the duct model to a duct modeling application for rendering.

In another particular implementation, a device includes means for receiving, from an automated duct definition interface, a plurality of duct definition parameters associated with a duct. The device also includes means for, in response to the receiving, building a duct definition database based at least on the plurality of duct definition parameters, the duct definition database further comprising a plurality of operational parameters associated with the duct. The device also includes means for generating a duct model associated with the duct based at least on the duct definition database. The device also includes means for communicating the duct model to a duct modeling application for rendering.

In another particular implementation, a non-transient, computer-readable medium stores instructions executable by one or more processors to perform operations that include receiving, from an automated duct definition interface, a plurality of duct definition parameters associated with a duct. The operations also include, in response to the receiving, building a duct definition database based at least on the plurality of duct definition parameters, the duct definition database further comprising a plurality of operational parameters associated with the duct. The operations also include generating a duct model associated with the duct based at least on the duct definition database. The operations also include communicating the duct model to a duct modeling application for rendering.

In another particular implementation, a system includes a memory configured to store instructions and one or more processors configured to receive, from an automated duct definition interface, a plurality of duct definition parameters associated with a duct. The one or more processors are also configured to, in response to the receiving, build a duct definition database based at least on the plurality of duct definition parameters, the duct definition database further comprising a plurality of operational parameters associated with the duct. The one or more processors are also configured to generate a duct model associated with the duct based at least on the duct definition database. The one or more processors are also configured to communicate the duct model to a duct modeling application for rendering.

The features, functions, and advantages described herein can be achieved independently in various implementations or can be combined in yet other implementations, further details of which can be found with reference to the following description and drawings.

DETAILED DESCRIPTION

Aspects disclosed herein illustrate improved duct modeling using an improved duct definition interface to improve the efficiency and effectiveness of duct modeling, particularly by improving the quality and accuracy of duct models prior to the models being submitted for rendering. Rather than rely exclusively on a modeler's engineering knowledge and expertise, the systems and methods disclosed herein can automatically guide a modeler in the model generation process with accurate information that adapts guidance to a user's prior input.

In certain current duct modeling systems, it can take a design engineer more than eighty hours for proper module creation. The systems and methods disclosed herein significantly reduce this timeframe by accurately creating duct models and two-dimensional and/or three-dimensional representation(s) of those models in a matter of minutes. This can reduce engineering and/or drafting errors that lead to production and manufacturing issues when the part is being constructed and installed in a complex machine such as an aircraft. The systems and methods disclosed herein can also create consistency in modeling for suppliers since each supplier can receive the same modeling format.

Further, the systems and methods disclosed herein can reduce the amount of computing resources involved in the generation and rendering of three-dimensional models of ducts. Standardizing and validating data input to a model generation process can reduce the errors associated with model generation. With standardized, validated data input, model generation is more accurate, more straightforward, and less prone to resource-intensive crashes.

Still further, the systems and methods disclosed herein provide an improved user interface for data input. By limiting the set of choices available to a duct designer and limiting (and validating) subsequent options based on previous decisions, the data output from the user interface will be more standardized, more accurate, and more readily usable by subsequent systems (e.g., the model rendering engine).

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Figure 1:
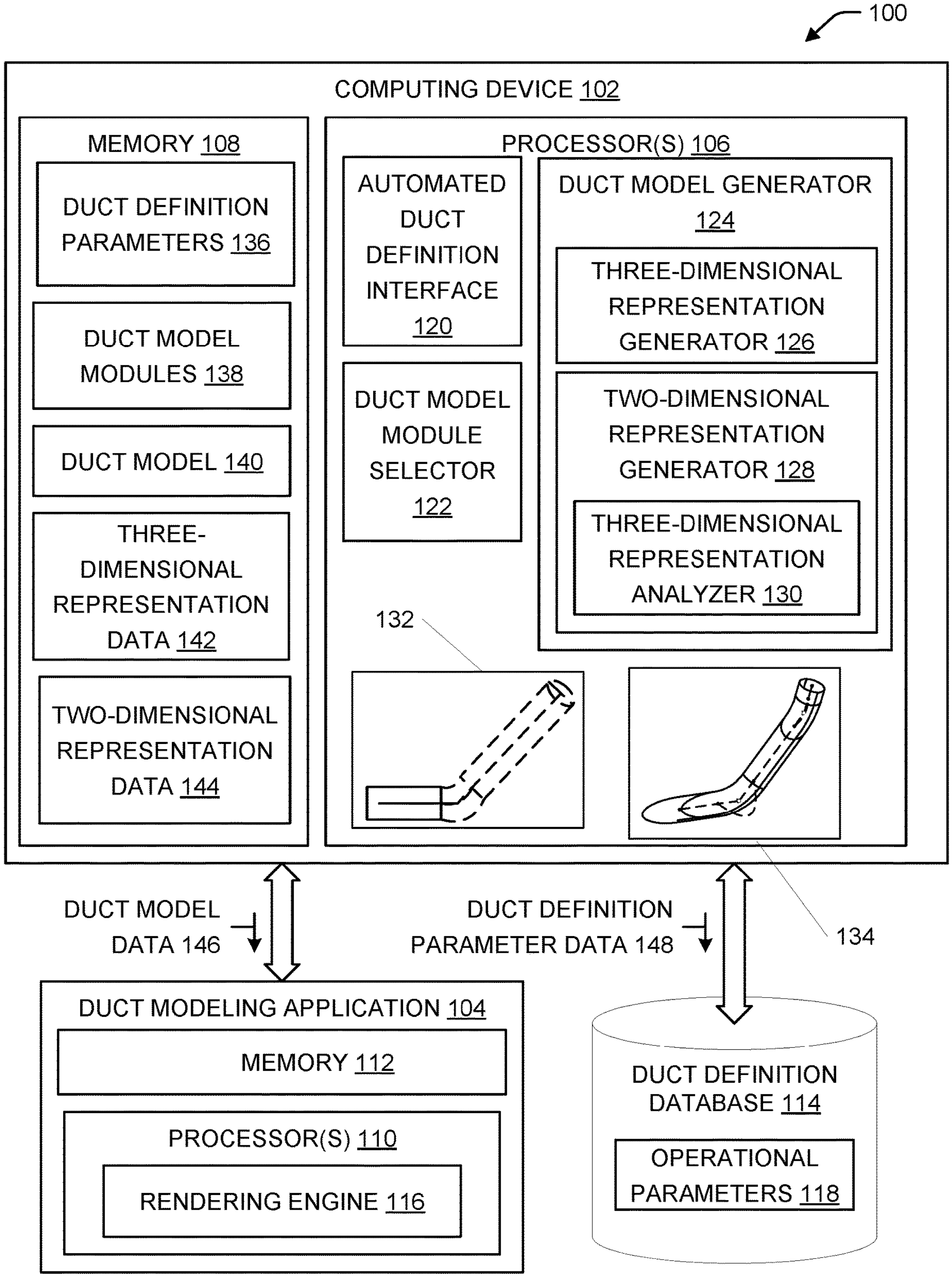
FIG. 1 depicts an example system for improved duct modeling using an improved duct definition interface, in accordance with at least one implementation of the subject disclosure.

Particular implementations are described herein with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. Further, some features described herein are singular in some implementations and plural in other implementations. To illustrate, FIG. 1 depicts a system 100 including one or more processors ("processor(s)" 106 in FIG. 1), which indicates that in some implementations the system 100 includes a single processor 106 and in other implementations the system 100 includes multiple processors 106. For ease of reference herein, such features are generally introduced as "one or more" features and are subsequently referred to in the singular unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 3, multiple points are illustrated and associated with reference numbers 336A and 336B. When referring to a particular one of these points, such as the point 336A, the distinguishing letter "A" is used. However, when referring to any arbitrary one of these points or to these points as a group, the reference number 112 is used without a distinguishing letter.

The terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first." "second." "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating." "calculating." "using." "selecting." "accessing." and "determining" are interchangeable unless context indicates otherwise. For example, "generating," "calculating." or "determining" a parameter (or a signal) can refer to actively generating, calculating, or determining the parameter (or the signal) or can refer to using, selecting, or accessing the parameter (or signal) that is already generated, such as by another component or device. As used herein, "coupled" can include "communicatively coupled." "electrically coupled." or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

FIG. 1 depicts an example system 100 for improved duct modeling using an improved duct definition interface, in accordance with at least one implementation of the subject disclosure. In some implementations, the system 100 includes a computing device 102 coupled to a duct modeling application 104 and/or a duct definition database 114. The computing device 102 can include a memory 108 coupled to one or more processors 106.

In some implementations, the processor(s) 106 can include an automated duct definition interface 120, a duct model module selector 122, a duct model generator 124, or some combination thereof. The computing device 102 can be configured to receive, from the automated duct definition interface 120, a plurality of duct definition parameters 136 associated with a duct to be modeled. In some aspects, the plurality of duct definition parameters 136 can be stored at the memory 108.

In some implementations, the duct definition parameters 136 can each include one or more data values associated with one or more features of a duct to be modeled. For example, as described in more detail below with reference to FIGS. 5-8, the duct definition parameters 136 can each include one or more data values describing a duct's shape (e.g., straight, curved, etc.), part number, revision number, length, diameter, pressure usage (e.g., high pressure, low pressure, etc.), pressure application (e.g., negative pressure, positive pressure, etc.), particular material, material description, end type(s) (e.g., beaded, bell, no bead, etc.), assembly part number, assembly revision number, insulation information, sleeve information, other features, or some combination thereof.

In some implementations, the automated duct definition interface 120 can include one or more units configured to prompt a user of the automated duct definition interface 120 for information. The unit(s) of the automated duct definition interface 120 can be configured to determine one or more of the duct definition parameters 136 based at least on user input to the particular unit of the automated duct definition interface 120.

In a particular aspect, the automated duct definition interface 120 can include a duct shape selection unit configured to prompt the user for information on a shape of the duct to be modeled. Based at least on the user's input, the duct shape selection unit can be configured to store the information in data fields corresponding to one or more duct definition parameters 136. For example, as described in more detail below with reference to FIG. 5, if the user identifies a duct to be modeled as straight, a duct shape selection unit 502 of the automated duct definition interface 120 can be configured to prompt a user to input, among other information, a shape identifier, a duct length, a duct diameter, a duct pressure usage, a duct pressure application, etc., or some combination thereof. The duct shape selection unit 502 can be configured to store the user input in one or more data fields 520, 522, 524, 526, 528. The computing device 102 can be configured to store the data as one or more duct definition parameters 136, analyze the data in the data fields 520, 522, 524, 526, 528 to generate data for one or more duct definition parameters, or some combination thereof.

In another particular aspect, the automated duct definition interface 120 can include a duct feature selection unit configured to prompt the user for information on one or more features of a duct to be modeled. Based at least on the user's input, the duct feature selection unit can be configured to store the information in data fields corresponding to one or more duct definition parameters 136. For example, as described in more detail below with reference to FIG. 6, if the user identifies a duct to be modeled as including a particular end type (e.g., bead end, bell mouth, etc.), a duct feature selection unit 602 of the automated duct definition interface 120 can be configured to prompt the user to input, among other information, a shape identifier, a centerline associated with a curved duct, other appropriate duct shape-related information, or some combination thereof. The duct feature selection unit 602 can be configured to store the user input in one or more data fields 654, 656, 658. The computing device 102 can be configured to store the data as one or more duct definition parameters 136, analyze the data in the data fields 654, 656, 658 to generate data for one or more duct definition parameters, or some combination thereof.

In a further particular aspect, the automated duct definition interface 120 can include a duct assembly selection unit configured to prompt the user for assembly information for a duct to be modeled. Based at least on the user's input, the duct assembly selection unit can be configured to store the information in data fields corresponding to one or more duct definition parameters 136. For example, as described in more detail below with reference to FIG. 7, if the user identifies the duct as an assembly, a duct assembly selection unit 702 can be configured to prompt the user to input, among other information, an assembly part number, an assembly revision number, an insulation indication, an insulation part number, a sleeve indication, etc., or some combination thereof. The duct assembly selection unit 702 can be configured to store the user input in one or more data fields 754, 756, 758. The computing device 102 can be configured to store the data as one or more duct definition parameters 136, analyze the data in the data fields 754, 756, 758 to generate data for one or more duct definition parameters, or some combination thereof.

The automated duct definition interface 120 can include other units configured to prompt the user for information on the duct to be modeled. For example, the duct definition interface 120 can include a dimension selection unit configured to prompt the user for information on duct dimension(s) (e.g., length of the duct, a diameter of the duct, other appropriate dimension-related information, or some combination thereof), a duct pressure selection unit configured to prompt the user for information on duct pressure (e.g., a high-pressure identifier, a low-pressure identifier, other appropriate pressure-related information, or some combination thereof), a duct material selection unit configured to prompt the user for information on duct material(s) (e.g., a material type identifier, a material name identifier, other appropriate material-related information, or some combination thereof), other duct information units, or some combination thereof. Each unit of the automated duct definition interface 120 can be configured to prompt the user for information about the duct to be modeled that can correspond to one or more of the duct definition parameters 136.

In some implementations, the automated duct definition interface 120 can be configured to automatically limit user choices within the automated duct definition interface 120 based at least on prior selection(s) within the automated duct definition interface 120. For example, as described in more detail below with reference to FIG. 6, the duct feature selection unit 602 of the automated duct definition interface 120 can be configured to solicit user input on the "End 1 Bead Type" (e.g., at 630) and present options for the bead type (e.g., at 632, 634, 636, 638) if the user selects "Beaded End" (e.g., at 616) in response to a solicitation for user input about the "duct end type, end 1" (e.g., at 608). As another example, as described in more detail below with reference to FIG. 7, the duct assembly selection unit 702 of the automated duct definition interface 120 can be configured to only solicit user input on "Insulation Part Number" (e.g., at 724) and present an option for insulation part number (e.g., at 726) in response to an indication that the assembly should include insulation (e.g., at 720).

In some implementations, the automated duct definition interface 120 can be configured to generate a preview of the duct based at least on a user's selection within the automated duct definition interface 120. For example, as described in more detail below with reference to FIG. 6, the automated duct definition interface 120 can be configured to generate a preview 646 of a duct based at least on a user's selection within the automated duct definition interface. As a particular example, the preview 646 of FIG. 6 includes a beaded end at a first end 650 based at least on a user's selection of a beaded end (e.g., at 616) in response to a solicitation of user input for the "duct end type, end 1" (e.g., at 608). As another particular example, the preview 646 of FIG. 6 includes a bell mouth at a second end 652 based at least on a user's selection of a bell mouth (e.g., a selection of duct feature 618) in response to a prompt 610 of user input for the "duct end type, end 2."

In operation, the automated duct definition interface 120 can guide a user through a duct definition process. By guiding a user through the process and limiting choices for user input based on previous input, the improved duct definition interface can allow a user with less duct engineering experience and/or knowledge to successfully complete an accurate duct modeling exercise.

In some implementations, the computing device 102 of FIG. 1 can be configured to receive, from the automated duct definition interface 120, the duct definition parameters 136 associated with the duct to be modeled. The computing device 102 can also be configured to automatically build the duct definition database 114 based at least on the plurality of duct definition parameters 136.

In some aspects, the computing device 102 can be configured to, in response to receiving the plurality of duct definition parameters 136, build the duct definition database 114 by automatically generating a plurality of database records for storage in non-transient, computer-readable media. For example, the computing device 102 can be configured to generate a spreadsheet or relational database containing data associated with the duct definition parameters 136. In a particular example, the computing device can communicate duct definition parameter data 148 associated with the duct definition parameters 136 to the duct definition database 114 for storage. In a particular configuration, the duct definition parameters 136 and the duct definition parameter data 148 are substantially the same data. In the same or alternative configuration, the duct definition parameter data 148 is a subset of the duct definition parameters 136, a superset of a plurality of duct definition parameters 136, an encoded or decoded version of one or more duct definition parameters 136, metadata associated with one or more duct definition parameters 136, other data associated with the duct definition parameters 136, or some combination thereof.

In some implementations, the duct definition database 114 can also include a plurality of operational parameters 118 associated with the duct to be modeled. The operational parameters 118 can be one or more data values associated with facets of manufacturing or producing the duct to be modeled that may be indirectly related to the duct itself. For example, the operational parameters 118 can include one or more data values associated with material type parameters (e.g., limits on a material's temperature rating, pliability, etc.), manufacturing processing parameters (e.g., a particular part can or cannot be manufactured through laser cutting, water cutting, etc.), shipping parameters (e.g., shipments must be trackable, hazardous materials notifications, etc.), finish parameters (e.g., paint may or may not be applied, etc.), other operational parameters, or some combination thereof.

In some aspects, the operational parameters 118 can be stored at the memory 108 prior to the build of the duct definition database 114. In the same or alternative aspects, the operational parameters 118 can be received by the computing device 102 from another data source prior to and/or as part of automatically building the duct definition database 114.

In some implementations, the computing device 102 can be configured to generate a duct model 140 associated with the duct to be modeled based at least on the duct definition database 114. In some aspects, a duct model generator 124 can be configured to generate the duct model 140. In some aspects, the duct model 140 can be stored at the memory 108. The duct model 140 is, for the purposes of this disclosure, one or more data values that are representative of a particular duct to be manufactured, where the one or more data values specify substantially all of the data needed to model the particular duct in line with the operational requirements associated with the duct. In a particular aspect, the duct model 140 is a model-based definition ("MBD") of the duct. An MBD can be supplied to a model rendering engine to define, for example, geometric dimensioning and tolerancing, component level materials, assembly-level bills of materials, engineering configurations, design intent, etc.

In a particular aspect, generating the duct model 140 can include storing one or more of the operational parameters 118 as metadata of the duct model 140. In some aspects, some or all of the operational parameters 118 can be specific to a particular customer or user. For example, a particular user may have a higher tolerance for duct performance variance if materials are less expensive. Such information can be stored as the operational parameters 118. By including the operational parameters 118 as part of the duct model 140 (as described below), a duct modeling application can be improved to allow for adaptation to specific user needs.

In some aspects, the duct model 140 can include a three-dimensional representation of the duct, a two-dimensional representation, or both. The illustrative example of FIG. 1 shows an exemplary two-dimensional representation 132 of a curved duct to be modeled, as well as an exemplary three-dimensional representation 134 of the curved duct to be modeled. In some aspects, a three-dimensional representation generator 126 of the duct model generator 124 can be configured to generate the three-dimensional representation.

In the same or alternative aspects, a two-dimensional representation generator 128 of the duct model generator 124 can be configured to generate the two-dimensional representation.

In a particular aspect, the two-dimensional representation 132 can be generated based on the three-dimensional representation 134. For example, a three-dimensional representation analyzer 130 of the two-dimensional representation generator 128 can be configured to analyze the three-dimensional representation 134 to provide data to the two-dimensional representation generator 128 to generate the two-dimensional representation 132. An example of analyzing the three-dimensional representation is described in more detail below with reference to FIGS. 3-4.

In some configurations, three-dimensional representation data 142 associated with the three-dimensional representation 134 can be stored at the memory 108 and used to generate the duct model 140. In the same or alternative configurations, two-dimensional representation data 144 associated with the two-dimensional representation 132 can be stored at the memory 108 and used to generate the duct model 140. Two-dimensional and three-dimensional representations are described in more detail below with reference to FIGS. 2-4.

In some aspects, generating the duct model 140 includes generating the duct model 140 using one or more duct model modules 138, which can in some implementations be stored at the memory 108. Each of the plurality of duct model modules 138 can be associated with one or more features of the duct to be modeled. For example, a higher level duct model module 138 can be associated with a particular material type for a duct (e.g., two-ply composite, non-composite, polyvinylidene fluoride ("PVDF"), honeycomb core, etc.). A lower level duct model module 138 can be associated with one or more particular features of a duct (e.g., ply buildup (end 1), ply buildup (end 2), ply buildup (support locations), ply buildup (stiffening rings), hole(s), bead (type 1, end 1), bead (type 2, end 1), bead (type 1, end 2), bead (type 2, end 2), bell mouth end (end 1), bell mouth end (end 2), PVDF end (type 1, end 1), PVDF end (type 1, end 2), PVDF end (type 2, end 1), PVDF end (type 2, end 2), honeycomb core curved duct body, PVDF curved duct body, non-composite curved duct body, two-ply composite curved duct body, index strip check, insulation part, test port part, etc. Other duct model modules 138 can be associated with one or more meta-features of a duct (e.g., centerline preprocessing, centerline measurements, ply table(s), file path(s), data manipulation units, geometrical set units to generate geometrical sets to store data associated with the operational parameters 118, etc.).

In some aspects, individual ones of the duct model modules 138 can call other of the duct model modules 138, nest under other of the duct model modules 138 or have other logical relationships with other of the duct model modules 138. For example, a PVDF duct module can call a plurality of PVDF end modules, a non-composite duct module can call a plurality of non-composite end modules, etc.

In some aspects, the computing device 102 is configured to select one or more of the duct model modules 138 based at least on the duct definition parameters 136. For example, if a user selects a "straight" duct formed of non-composite material to be modeled for a specific customer or user, the computing device 102 can be configured to select a non-composite duct module (and thus any nested or subsequently-selected modules) and any appropriate meta-feature units (e.g., data manipulation and geometrical set generation modules). Any modules directed to analyzing a centerline for a curved duct, any units associated with a composite or PVDF duct, etc., may not be selected by the computing device 102 based at least on the duct definition parameters 136.

In some aspects, the selected duct model modules 138 can work together to generate the duct model 140. For example, data output from a non-composite duct module (and thus any nested or subsequently-selected modules) and any appropriate meta-feature modules (e.g., data manipulation and geometrical set generation units) can be used to generate the duct model 140 for a straight duct formed of non-composite material to be modeled for a specific customer or user.

As an illustrative example, if a user selects, in the automated duct definition interface 120, a straight duct formed of two-ply composite material to be modeled, the computing device 102 can be configured to receive the duct definition parameters 136 from the automated duct definition interface 120 based on the user's selection(s). After automatically building the duct definition database 114 based on the duct definition parameters 136, the duct model generator 124 can be configured to select one or more duct model modules from the plurality of duct model modules 138 associated with a straight duct formed of two-ply composite material. The duct model generator 124 can be configured to generate the duct model 140 using the duct model module(s) 138. Each of the duct model modules 138 can include instructions (e.g., Visual Basic for Applications code) executable by the processor(s) 106 to perform operations associated with modeling one or more duct features. For example, the duct model generator 124 can generate the duct model 140 using a two-ply composite base model module, a centerline preprocessing module, and a geometrical sets module. If the user specified particular features of the duct to be modeled, the duct model generator 124 can select and use additional duct model modules 138. For example, if the user specified that the duct should include a beaded end, the duct model generator 124 can select a duct model module 138 associated with a composite bead. The various duct model modules 138 can be used collectively by the duct model generator 124 to generate the duct model 140.

In some implementations, the computing device 102 can be configured to communicate the duct model 140 to a duct modeling application 104 for rendering. In some aspects, the computing device 102 can be configured to communicate duct model data 146 associated with the duct model 140 to the duct modeling application 104. In a particular aspect, the duct model 140 and the duct model data 146 are substantially the same data. In the same or alternative aspects, the duct model data 146 is a subset of the duct model 140, an encoded or decoded version of the duct model 140, metadata associated with the duct model 140, other data associated with the duct model 140, or some combination thereof.

In some implementations, the duct modeling application 104 can include a memory 112 coupled to one or more processors 110. The processor(s) 110 can include a rendering engine 116 configured to render the duct model 140 for output to a user of the computing device 102 and/or the duct modeling application 104. In a particular aspect, the rendering engine 116 is a three-dimensional representation rendering engine such as AutoCAD® or CATIA® (AutoCAD is a registered trademark of Autodesk, Inc., a Delaware corporation. CATIA is a registered trademark of Dassault Systèmes Société Européenne, a French corporation). The duct model 140, the duct model data 146, or both can include data that allows the rendering engine 116 to render the duct model 140. For example, for a CATIA rendering engine, the duct model data 146 can include data associated with one or more CATIA models (e.g., Straight_Duct_Base_Model CATIA Part, Straight_Duct_Base_Model_Non-Composite CATIA Part, Ply_Buildup_PC, Hole_PC CATIA Part, Bead_PC Type 1 CATIA Part, Bead_PC Type 2 CATIA Part, Bell_Moth_PC, PVDF_Straight_Duct_Base_Model CATIA Part, PVDF_Type1_PC_End, PVDF_Type2_PC_End, PVDF_Type3_PC_End, PVDF_Type4_PC_End, PVDF_Type5_PC_End, PVDF_Type6_PC_End. PVDF_Type7_PC_End, Curved Duct Honeycomb Core, Curved Duct Rib on Polyline PC, Curved Duct 2-Ply, etc.). In a particular aspect, the one or more CATIA models can be generated by one or more corresponding duct model modules 138.

In operation, the automated duct definition interface 120 can walk a user step-by-step through a duct definition process, resulting in the generation of a plurality of duct definition parameters 136. Based at least on the plurality of duct definition parameters 136, the computing device 102 can automatically build a duct definition database 114 that also includes a plurality of operational parameters 118 associated with the duct. The computing device 102 can then, based at least on the duct definition database 114, generate a duct model 140 that the computing device 102 can communicate to the duct modeling application 104 for rendering by the rendering engine 116. Exemplary illustrations of certain aspects of these operations are described in more detail below with reference to FIGS. 2-8.

Figure 2:
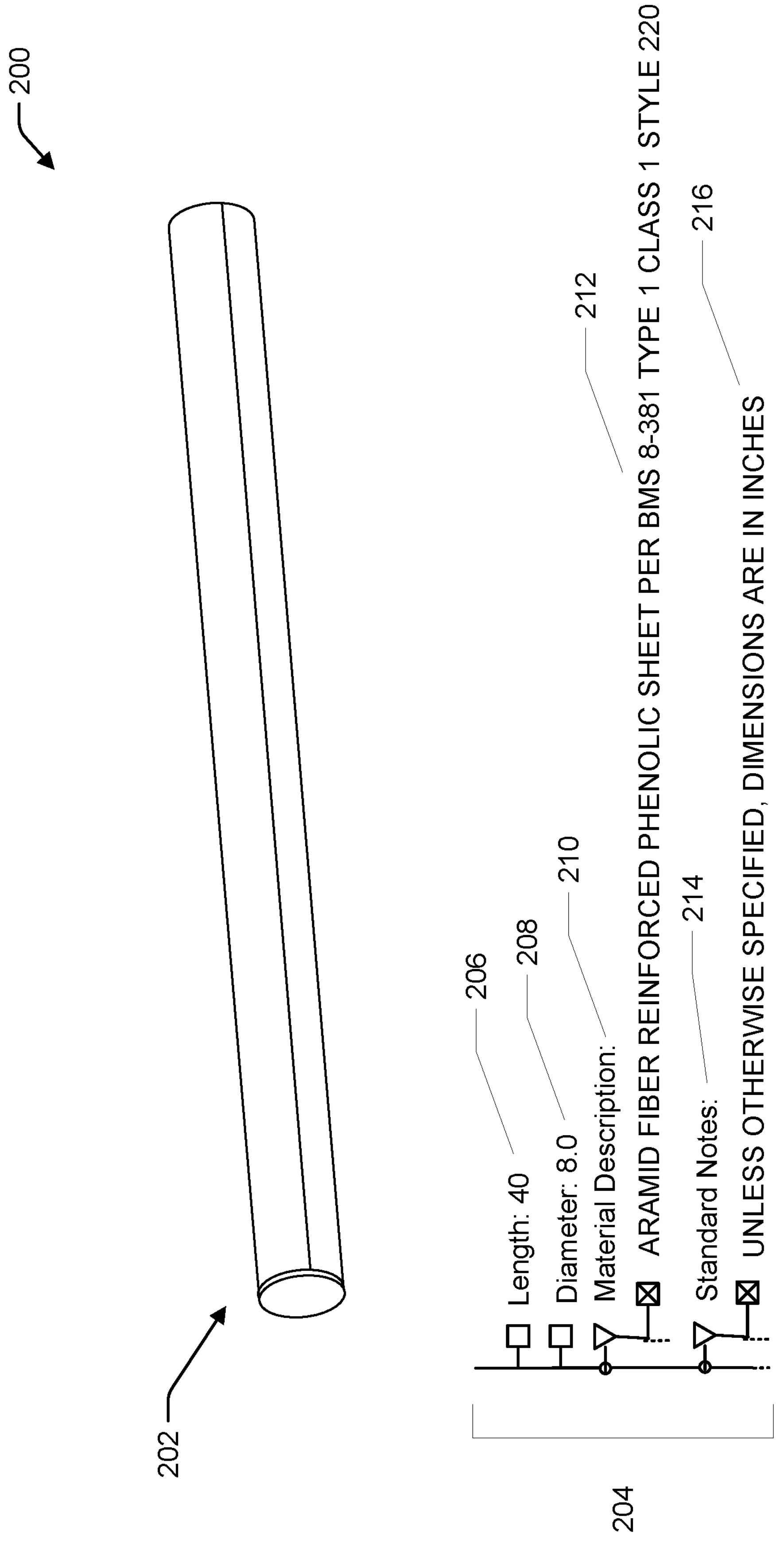
FIG. 2 illustrates an example duct model associated with a straight duct, in accordance with at least one implementation of the subject disclosure.

FIG. 2 illustrates an example duct model 200 associated with a straight duct to be modeled, in accordance with at least one implementation of the subject disclosure. The duct model 200 includes an exemplary rendering (e.g., by the rendering engine 116) of the duct model 140 described in more detail above with reference to FIG. 1.

In some aspects, the duct model 200 includes a three-dimensional representation 202 of the straight duct, along with a plurality of duct model parameters 204. In a particular aspect, the duct model parameters 204 include duct definition parameters 206, 208 (i.e., one or more of the duct definition parameters 136 of FIG. 1), as well as a operational parameters 210, 212, 214 (i.e., one or more of the operational parameters 118 of FIG. 1). In the exemplary illustration of FIG. 2, the first duct definition parameter 206 describes the length of the duct (e.g., 40 inches) and the second duct definition parameter 208 describes the diameter of the duct (e.g., 8.0 inches). The first operational parameter 210 describes a first operational parameter category (e.g., "Material Description"), the second operational parameter 212 describes the particular type of material of which the duct is to be manufactured, the third operational parameter 214 describes a second operational parameter category (e.g., "Standard Notes"), and the fourth operational parameter 216 describes an exemplary member of the second operational parameter category.

As illustrated, the duct model 200 of FIG. 2 can include additional duct model parameters 204, although only six particular parameters are illustrated. Further, although six particular duct model parameters 204 are illustrated in FIG. 2, more, fewer, or different duct model parameters 204 can be present without departing from the scope of the subject disclosure. For example, a curved duct may require duct model parameters 204 describing a centerline of the duct, a particular duct modeling application and/or rendering engine (e.g., a particular implementation of the duct modeling application 104 and/or the rendering engine 116 of FIG. 1 such as CATIA) may require more, fewer, or different data values to be able to render a representation of the duct model 200, a particular customer or user may have more, fewer, or different operational parameters, etc.

Figure 3:
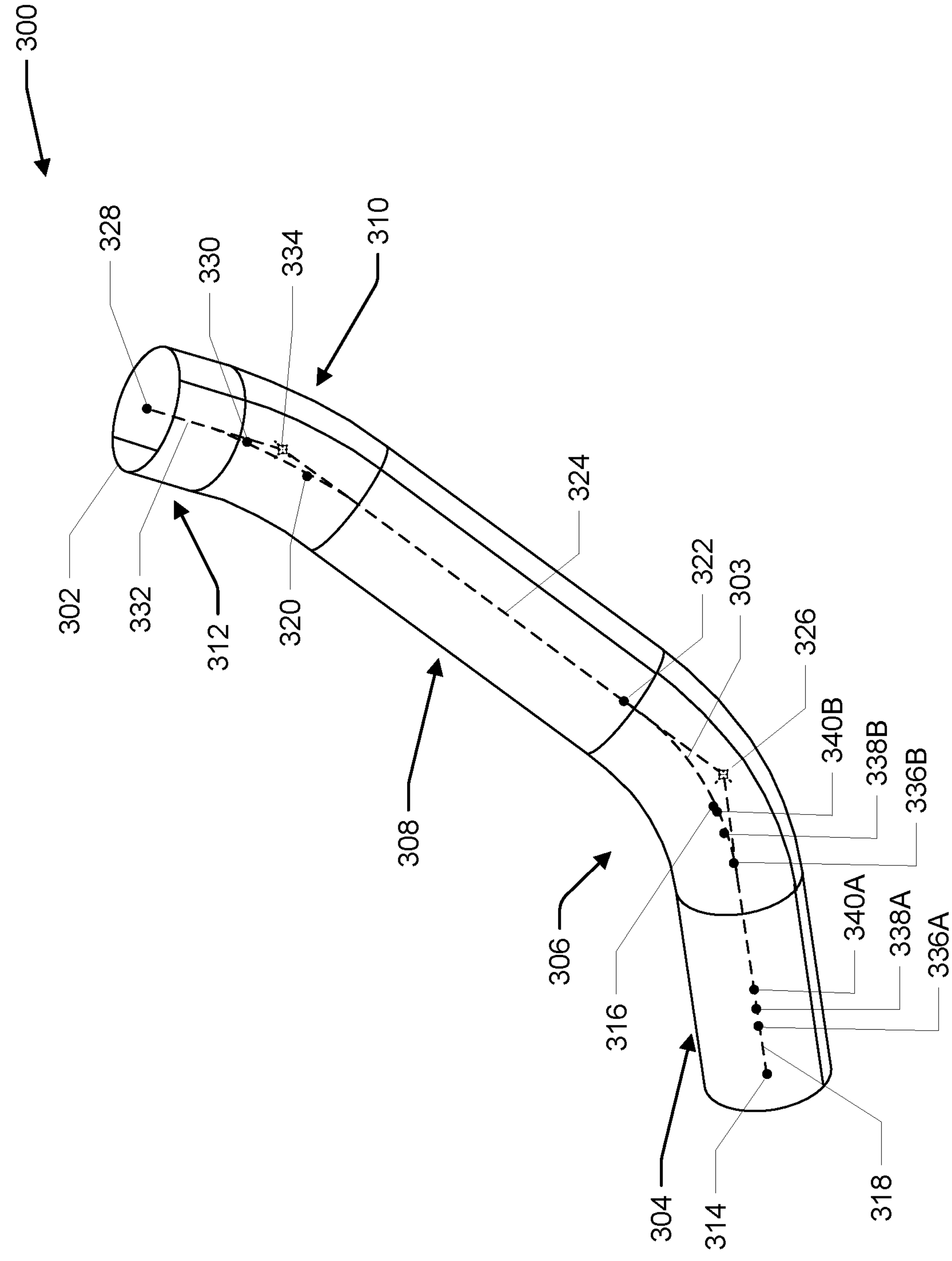
FIG. 3 illustrates an example three-dimensional representation of a curved duct, in accordance with at least one implementation of the subject disclosure.

FIG. 3 illustrates an example three-dimensional representation 300 of a curved duct 302, in accordance with at least one implementation of the subject disclosure. The three-dimensional representation 300 shows a curved duct 302 having a centerline 303. The duct 302 includes a first straight portion 304, a second straight portion 308, a third straight portion 312, a first bend 306 between the first straight portion 304 and the second straight portion 308, and a second bend 310 between the second straight portion 308 and the third straight portion 312.

In some aspects, the three-dimensional representation 300 can be generated by a three-dimensional representation generator (e.g., the three-dimensional representation generator 126 of FIG. 1) based at least on one or more data values in a duct definition database (e.g., the duct definition database 114 of FIG. 1). As described above with reference to FIG. 1, in a particular aspect the computing device 102 can be configured to analyze the three-dimensional representation 300 (e.g., by the three-dimensional representation analyzer 130) to generate a two-dimensional representation of the duct 302. Exemplary two-dimensional representations of the duct 302 are described in more detail below with reference to FIGS. 4A-4D.

In a particular aspect, the three-dimensional representation 300 can be analyzed to identify one or more bends in the duct 302. For example, the three-dimensional representation analyzer 130 of FIG. 1 can analyze the three-dimensional representation 300 to determine a bend location associated with each of the first bend 306 and the second bend 310.

In a particular aspect, the three-dimensional representation 300 can be analyzed to determine one or more bend locations through an iterative bend identification process. The iterative bend identification process can include generating at least three points along a portion of the centerline 303, determining whether the at least three points are colinear, and, if the at least three points are not colinear, identifying a location within the three-dimensional representation 300 of the duct 302 where a bend exists. These steps can be repeated along a length of the centerline 303.

For example, the three-dimensional representation analyzer 130 of FIG. 1 can analyze the three-dimensional representation 300 to determine a bend location associated with the first bend 306 and a bend location associated with the second bend 310. First, the three-dimensional representation analyzer 130 of FIG. 1 can generate the centerline points 336, 338, 340 along a portion of the centerline 303 corresponding to the first straight portion 304. The three-dimensional representation analyzer 130 can determine whether the three points are colinear and, if they are not, identify a bend location associated with the first bend 306. As illustrated in FIG. 3, the centerline points 336, 338, 340 are at a first location along the centerline 303 at 336A, 338A, 340A, respectively. As the centerline points 336A, 338A, 340A are colinear, the three-dimensional representation analyzer 130 can move the centerline points 336, 338, 340 to a second location along the centerline 303 at 336B, 338B, 340B, respectively. As the centerline points 336B, 338B, 340B are not colinear, the three-dimensional representation analyzer 130 of FIG. 1 identifies a bend location 316 associated with the first bend 306. The three-dimensional representation analyzer 130 can then move one or more of the centerline points 336, 338, 340 along the centerline 303 in increments, determining whether the centerline points 336, 338, 340 are colinear after each increment. Through such an iterative process, the three-dimensional representation analyzer 130 can identify one or more bend point locations associated with each bend in the duct to be modeled.

In a particular aspect, the bend location can be associated with the centerline point closest to an end of the centerline when the centerline points were identified as non-colinear. For example, the bend location can be associated with the centerline point 336B. In the same or alternative particular aspects, the bend location can be associated with the centerline point farthest from the end of the centerline when the centerline points were identified as non-colinear. For example, the bend location can be associated with the centerline point 340B. The particular configuration of identifying the bend location 316, the distance between the points 336, 338, 340, the number of points, the distance the points 336, 338, 340 move between iterations, etc. can vary based on the particular implementation without departing from the scope of the subject disclosure.

In some aspects, the three-dimensional representation 300 can be analyzed along substantially all of the length of the centerline 303 to determine a location associated with each bend in the duct 302. For example, the three-dimensional representation analyzer 130 of FIG. 1 can be configured to repeat the iterative bend identification process described above along the length of the centerline 303 to identify a bend location 320 associated with the second bend 310. In the same or alternative aspects, the three-dimensional representation 300 can be analyzed along substantially all of the length of the centerline 303 to determine a location associated with each bend in the duct 302 starting at a different end of the duct 302. Such a process may, for example, identify the location 330 as associated with the second bend 310 and the location 322 as associated with the first bend 306. In a particular aspect, the three-dimensional representation analyzer 130 of FIG. 1 can be configured to perform the iterative bend identification process from both ends of the centerline 303, identifying a plurality of locations associated with each of the bends 306, 310.

In some implementations, the three-dimensional representation 300 of the duct 302 can be analyzed to generate a two-dimensional representation of the duct 302. A two-dimensional representation of the duct 302 (e.g., the two-dimensional representation 132 of FIG. 1, the two-dimensional representation(s) 402, 404, 406, 408 of FIGS. 4A-4D, etc.) can include one or more views of the duct 302. For example, a two-dimensional representation of the duct 302 can include a front view, side view, top view, etc. Once a front view is determined, other views can be generated by, for example, automated rotations of the three-dimensional representation.

In some aspects, generating the front view of the three-dimensional representation 300 can include analyzing a plurality of vectors associated with the three-dimensional representation 300. In a particular aspect, generating the front view can include determining a first vector extending from a point 314 proximate a first end of the centerline 303 along a first substantially straight portion 318 of the centerline 303. Generating the front view can also include determining a second vector extending from the point 314 to a point along the first bend 306 (e.g., the bend location 316).

Generating the front view can also include determining a viewing angle based at least on a cross product of the first vector and the second vector, wherein the front view corresponds to a view of the three-dimensional representation 300 from the viewing angle. As described below with reference to FIG. 4A, the front view can be selected based on a particular viewing angle of the three-dimensional representation 300 of the duct 302. In a particular implementation, the three-dimensional representation analyzer 130 of FIG. 1 can determine the front view to be associated with a viewing angle based on a vector that is orthogonal to both the straight portion of the centerline 303 and a line from an end of the duct 302 to the first bend (e.g., the first bend 306).

In some implementations, generating a two-dimensional representation of the duct 302 based on the three-dimensional representation 300 of the duct 302 can also account for various dimensions associated with the duct 302. For example, in generating the two-dimensional representation of the duct 302, the two-dimensional representation generator 128 of FIG. 1 can be configured to determine a distance from one end of the centerline 303 to a point along the one or more bends 306, 310. In some aspects, the three-dimensional representation analyzer 130 of FIG. 1 can be configured to identify a bend coordinate 326, 334 associated with each of the bends 306, 310. The two-dimensional representation generator 128 of FIG. 1 can be configured to generate the two-dimensional representation of the duct 302 to include one or more dimensions associated with one or more of the bend coordinates 326, 334, as described in more detail below with reference to FIGS. 4A-4D.

In some aspects, the three-dimensional representation analyzer 130 of FIG. 1 can be configured to identify the first bend coordinate 326 by determining the first vector described above extending from the point 314 proximate the first end of the centerline 303 along the first substantially straight portion 318 of the centerline 303, determining a third vector extending along a second substantially straight portion 324 of the centerline 303 on an opposite side of the first bend 306 from the point 314, and identifying the bend coordinate 326 based on an intersection between the first vector and the third vector. Similarly, the three-dimensional representation analyzer 130 of FIG. 1 can be configured to identify the bend coordinate 334 by determining a fourth vector extending from a point 328 proximate a second end of the centerline 303 along a third substantially straight portion 332 of the centerline 303, determining a fifth vector extending along the second substantially straight portion 324 of the centerline 303 on an opposite side of the second bend 310 from the point 328 and toward the second end of the centerline 303, and identifying the bend coordinate 334 based on an intersection between the fourth vector and the fifth vector.

As described in more detail below with reference to FIGS. 4A-4B, generating the two-dimensional representation of the duct 302 based at least on the three-dimensional representation 300 can include additional processes and details. The analysis of the three-dimensional representation 300 of the duct 302 can improve the generation of the two-dimensional representation by automating analysis of the model to more quickly generate two-dimensional representations that may be necessary or helpful for manufacturing of the duct 302.

Figure 4B:
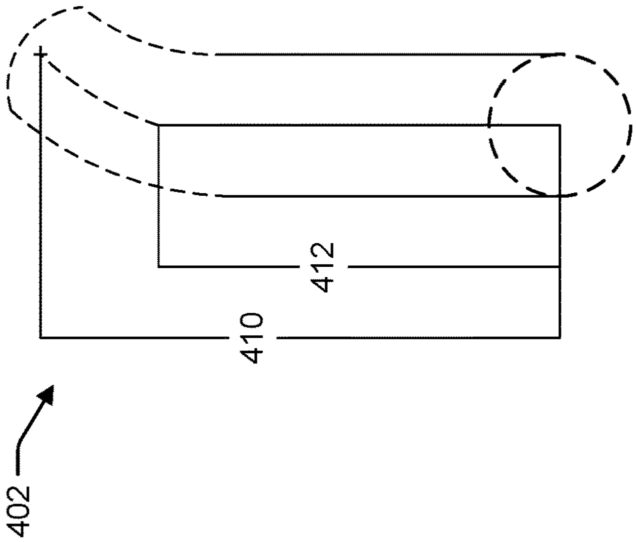
FIG. 4B illustrates a side view of the duct of FIG. 3 based at least on the three-dimensional representation, in accordance with at least one implementation of the subject disclosure.
Figure 4D:
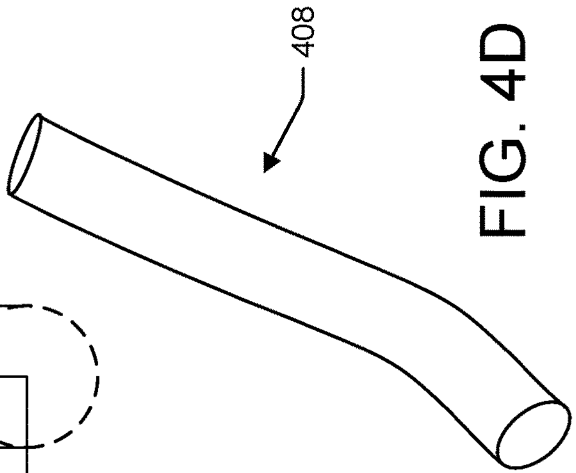
FIG. 4D illustrates an isometric view of the duct of FIG. 3 based at least on the three-dimensional representation, in accordance with at least one implementation of the subject disclosure.
Figure 4A:
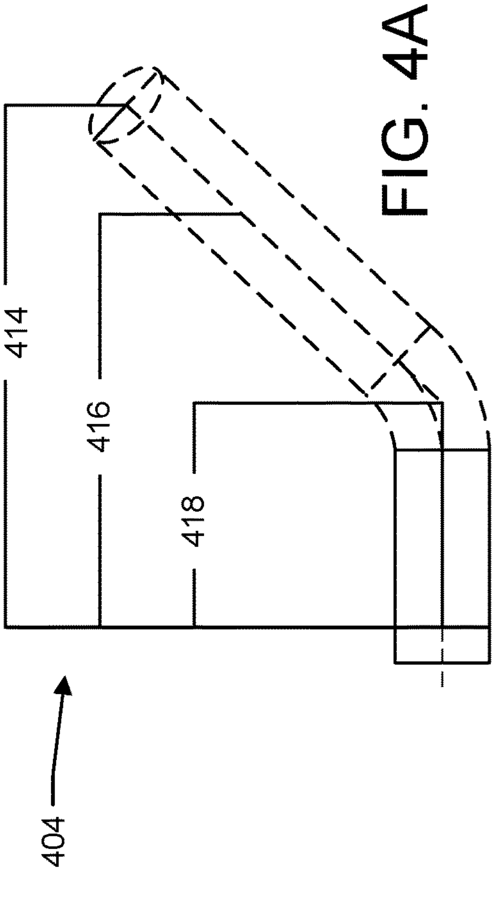
FIG. 4A illustrates a front view of the duct of FIG. 3 based at least on the three-dimensional representation, in accordance with at least one implementation of the subject disclosure.

FIG. 4A illustrates a front view two-dimensional representation 404 of the duct 302 of FIG. 3 based at least on the three-dimensional representation 300, in accordance with at least one implementation of the subject disclosure. As described in more detail above with reference to FIG. 3, the front view of the three-dimensional representation 300 can be selected in myriad ways, including a determination of a viewing angle based on the plurality of vectors described above and illustrated in FIG. 4A.

In some implementations, generating the two-dimensional representation can include adding one or more dimension annotations indicating one or more distances. For example, the front view two-dimensional representation 404 can include a first dimension annotation 418 indicating a distance between the point 314 of FIG. 3 and the first bend coordinate 326. The front view two-dimensional representation 402 can also include a second dimension annotation 416 indicating a distance between the point 314 of FIG. 3 and the second bend coordinate 334. The front view two-dimensional representation 402 can also include a third dimension annotation 414 indicating a distance between the point 314 of FIG. 3 and the point 328. Including such dimension annotation(s) can improve the two-dimensional representation at least by automating the creation of the dimension annotations based on analysis of the three-dimensional representation 300 of FIG. 3 for use by a manufacturer.

Figure 4C:
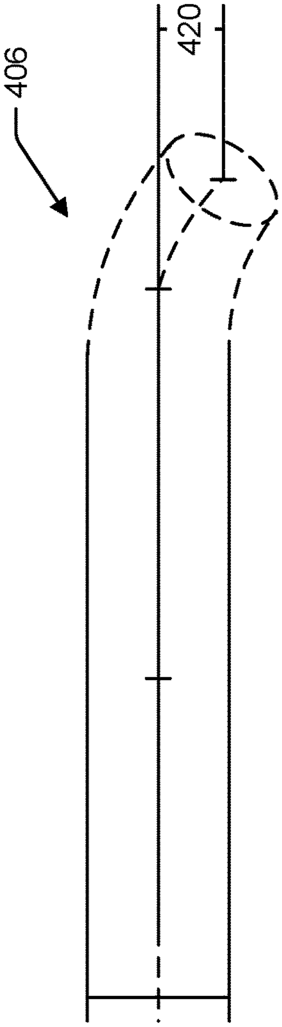
FIG. 4C illustrates a top view of the duct of FIG. 3 based at least on the three-dimensional representation, in accordance with at least one implementation of the subject disclosure.

Dimension annotations are also shown in FIGS. 4B-4C. FIG. 4B illustrates a side view two-dimensional representation 402 of the duct 302 of FIG. 3 based at least on the three-dimensional representation 300, in accordance with at least one implementation of the subject disclosure. Once the front view two-dimensional representation 404 of FIG. 4A is established, the side view two-dimensional representation 402 can be generated based on an automated ninety-degree rotation of the three-dimensional representation 300 of FIG. 3. The side view two-dimensional representation 402 can include a fourth dimension annotation 412 indicating a distance between the point 328 of FIG. 3 and the first bend coordinate 326 and a fifth dimension annotation 410 indicating a distance between the point 328 and the point 314.

FIG. 4C illustrates a top view two-dimensional representation 406 of the duct 302 of FIG. 3 based at least on the three-dimensional representation 300, in accordance with at least one implementation of the subject disclosure. Once the front view two-dimensional representation 404 of FIG. 4A is established, the top view two-dimensional representation 406 can be generated based on an automated ninety-degree rotation of the three-dimensional representation 300 of FIG. 3. The top view two-dimensional representation 406 can include a sixth dimension annotation 420 indicating a distance between the point 314 of FIG. 3 and the second substantially straight portion 324 of the centerline 303.

FIG. 4D illustrates an isometric view two-dimensional representation 408 of the duct 302 of FIG. 3 based at least on the three-dimensional representation 300, in accordance with at least one implementation of the subject disclosure. Once the front view two-dimensional representation 404 of FIG. 4A is established, the isometric view two-dimensional representation 408 can be generated based on an automatic rotation of the three-dimensional representation 300 of FIG. 3.

In some implementations, a two-dimensional representation of the duct 302 of FIG. 3 can include some or all of the views illustrated above with reference to FIGS. 4A-4D. In the same or alternative implementations, the two-dimensional representation of the duct 302 of FIG. 3 can include one or more different views of the duct 302 without departing from the scope of the subject disclosure. Further, although FIGS. 4A-4D illustrate particular views with certain annotations, more, fewer, and/or different annotations may be present within the two-dimensional representation without departing from the scope of the subject disclosure.

For example, a two-dimensional representation that includes the front view two-dimensional representation 404 of FIG. 4A, the side view two-dimensional representation 402 of FIG. 4B, the top view two-dimensional representation 406 of FIG. 4C, and the isometric view two-dimensional representation 408 of FIG. 4D can be gathered into a single place for presentation to a manufacturer. The representation can include the dimension annotations shown in FIGS. 4A-4D as well as other annotations. In a particular example, generating the two-dimensional representation (e.g., by the two-dimensional representation generator 128 of FIG. 1) can include automatically numbering one or more coordinate points. The front view two-dimensional representation 404 of FIG. 4A might therefore include annotations identifying the point 314 of FIG. 3, the first bend coordinate 326, the second bend coordinate 334, and the point 328 (i.e., the end points of each of the dimension annotations 414, 416, 418).

In another particular example, generating the two-dimensional representation (e.g., by the two-dimensional representation generator 128 of FIG. 1) can include adding an annotative text. This can include notes to the manufacturer, one or more of the duct definition parameters 136 of FIG. 1 (e.g., dimension descriptions, etc.), one or more of the operational parameters 118 (e.g., export control notes, proprietary information, etc.), two-dimensional representation identification information (e.g., schematic number, etc.), other appropriate annotative text, or some combination thereof.

In operation, the computing device 102 of FIG. 1 can be configured to generate a two-dimensional representation (e.g., the two-dimensional representation 132; one or more of the views 402, 404, 406, 408; etc.), a three-dimensional representation (e.g., the three-dimensional representation 300 of FIG. 3), or both. The computing device 102 can be particularly configured to generate the two-dimensional representation based on the three-dimensional representation, improving the duct modeling process by automating generation of information for duct manufacturing. As described in more detail above with reference to FIG. 1, the information can be based at least on a plurality of parameters received from an improved duct definition interface (e.g., the automated duct definition interface 120 of FIG. 1). FIGS. 5-8 below describe in more detail particular improvements to a duct definition interface.

Figure 5:
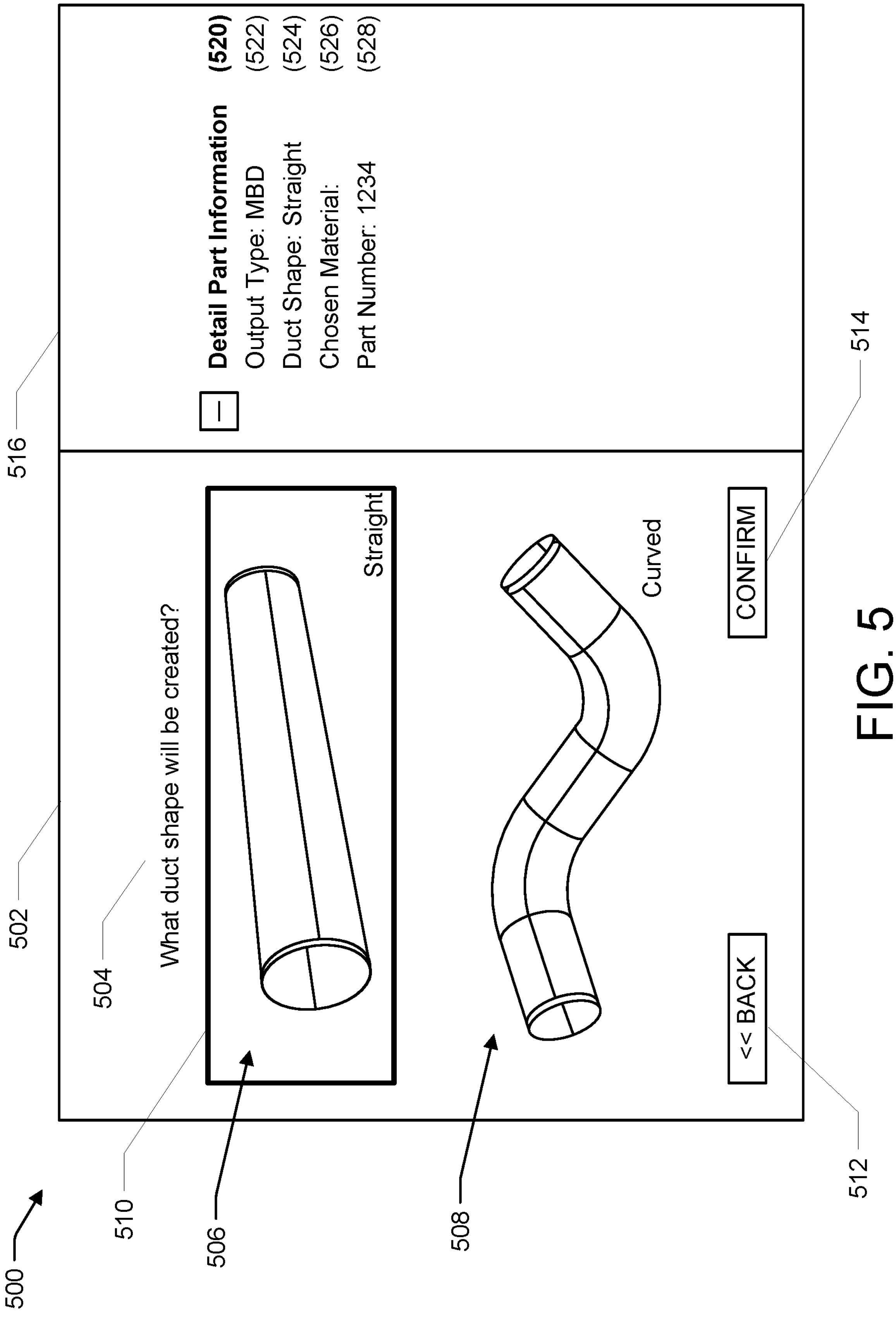
FIG. 5 illustrates an example of a portion of the automated duct definition interface of FIG. 1 including a duct shape selection unit and a parameter display unit, in accordance with at least one implementation of the subject disclosure.

FIG. 5 illustrates an example of a portion 500 of the automated duct definition interface 120 of FIG. 1 including the duct shape selection unit 502 and a parameter display unit 516, in accordance with at least one implementation of the subject disclosure. The duct shape selection unit 502 can include portions of the automated duct definition interface 120 of FIG. 1 configured to allow a user to select one or more shapes of a portion of the duct to be modeled.

In some aspects, the duct shape selection unit 502 can include a duct shape prompt 504 (e.g., "What duct shape will be created?" as illustrated in FIG. 5), one or more potential duct shapes 506, 508, and one or more additional function buttons 512, 514. For example, the potential duct shapes 506, 508 can include an option for a straight duct (e.g., at 510) and a curved duct (e.g., at 508). In a particular example, the duct shape selection unit 502 can also include a visual indication 510 of a user's selection between or among the plurality of potential duct shapes 506, 508.

Although FIG. 5 illustrates two particular potential duct shapes 506, 508, more, fewer, and/or different duct shapes can be present without departing from the scope of the subject disclosure. For example, the duct shape selection unit 502 can present a user with a straight shape option, a curved shape option, or an option to build an assembly with both straight and curved portions. As an additional example, the shape options presented to a user can depend on a user's previous input. Should a user's input to another unit of the automated duct definition interface 120 of FIG. 1 restrict the available duct shape options, a user may only be presented with a single duct shape option.

Further, while FIG. 5 illustrates the potential duct shapes 506, 508 as two-dimensional representations of model ducts, other presentations of the one or more potential duct shapes 506, 508 can be present without departing from the scope of the subject disclosure. For example, the automated duct definition interface 120 of FIG. 1 can display a three-dimensional representation of the duct, not display any visual representation of the duct, or some combination thereof.

In some aspects, the duct shape selection unit 502 can also include one or more additional function buttons 512, 514. The additional function buttons 512, 514 can, for example, allow a user to navigate to other portions of the automated duct definition interface 120 of FIG. 1. For example, the additional function button 512 can include the text "BACK" to indicate that a user can return to a prior user input portion. As an additional example, the additional function button 514 can include the text "CONFIRM" to indicate that the user can save the user's selection of the particular duct shape and continue to an additional user input portion.

In some implementations, the example portion 500 can also include the parameter display unit 516, which can be configured to display a plurality of data fields 520, 522, 524, 526, 528. The plurality of data fields 520, 522, 524, 526, 528 can include visual representation(s) of one or more parameters associated with the duct to be modeled, data associated with such visual representation(s), or some combination thereof. For example, the data field 520 can show the data fields 522, 524, 526, 528 as belonging to the heading "Detail Part Information," the data field 522 can show the chosen output type for the instant model as "MBD" or "Model-Based Definition," the data field 524 can show the chosen duct shape as "Straight," the data field 526 can show the chosen material once selected, and the data field 528 can show the chosen part number as "1234." Although FIG. 5 illustrates five data fields, more, fewer, and/or different data fields can be present without departing from the scope of the subject disclosure. For example, as described in more detail below with reference to FIG. 8, an exemplary parameter display unit can display all of the parameters associated with a particular duct to be modeled.

In some aspects, the plurality of data fields 520, 522, 524, 526, 528 can have various logical relationships among the data. In a particular implementation, the parameters display unit 516 can illustrate logical relationships among the plurality of data fields 520, 522, 524, 526, 528. For example, The data fields 522, 524, 526, 528 can be nested underneath the data field 520. The parameters display unit 516 can illustrate this relationship by allowing a user to collapse or expand the "Detail Part Information" category at data field 520 to show or hide the data fields 522, 524, 526, 528.

In some aspects, the plurality of data fields 520, 522, 524, 526, 528 can include data associated with parameters that a user has already specified, has yet to specify, have been generated by the computing device 102 of FIG. 1, other appropriate parameter data, or some combination thereof. In a particular aspect, some or all of the plurality of data fields 520, 522, 524, 526, 528 can be associated with one or more of the duct definition parameters 136 of FIG. 1. For example, the data field 528 showing the "Part Number" can have an associated value (e.g., "1234") previously specified by a user using another unit of the automated duct definition interface 120 or another portion of the duct shape selection unit 502. As another example, the data field 526 showing the "Chosen Material" can display an empty value because the user has not yet specified (or confirmed a selection), a value chosen by the user previously, or a value generated by the computing device 102 of FIG. 1 based on a user's selections.

In the same or alternative particular aspects, one or more of the plurality of data fields 520, 522, 524, 526, 528 can have values that change based on a user's selection in a unit. The parameters display unit 516 can be configured to reflect the user's selection(s) in real-time or near real-time. For example, in the duct shape selection unit 502, a user can select a "Straight" shape or a "Curved" shape for a duct to be modeled through the duct shape selection unit 502. If the user selects "Straight," the parameters display unit 516 can be configured to store the value "Straight" (e.g., as a duct definition parameter 136 of FIG. 1) and show that selection at data field 524. If the user changes their mind and selects "Curved," the parameters display unit 512 can be configured to store the value "Curved" (e.g., as a duct definition parameter 136) and show that selection at data field 524.

Although FIG. 5 illustrates certain prompts, data entry points, and other features, more, fewer, and/or different features can be present within the portion 500 without departing from the scope of the subject disclosure. For example, the duct shape selection unit 502 can include sub-units, screens, etc. that, based on the shape selection, solicit additional information (e.g., length, diameter, etc. for all; input centerline for curved ducts). In a particular example, the duct shape selection unit 502 can include or otherwise invoke the dimension selection unit, duct pressure selection unit, the duct material selection unit, or some combination thereof, as described above with reference to FIG. 1.

In a particular example, the duct shape selection unit 502 can also include a data entry portion that allows a user to define a centerline associated with a curved duct to be modeled. In a particular implementation, the user can provide a location of a data file that contains information describing the centerline. In the same or alternative implementations, the user can define the centerline within the duct shape selection unit 502.

Figure 6:
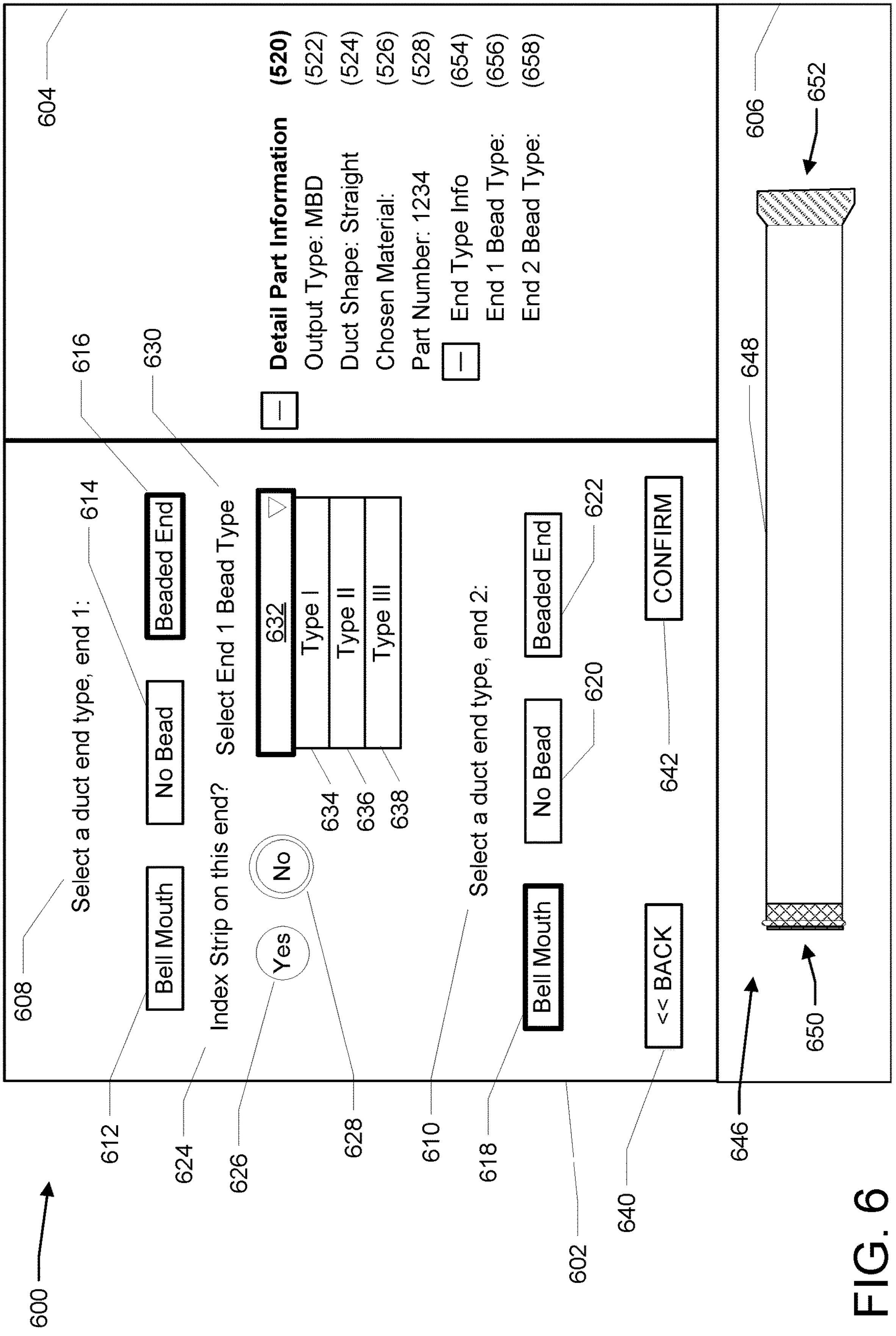
FIG. 6 illustrates an example of a portion of the automated duct definition interface of FIG. 1 including a duct feature selection unit and a parameter display unit, in accordance with at least one implementation of the subject disclosure.

FIG. 6 illustrates an example of a portion 600 of the automated duct definition interface 120 of FIG. 1 including a duct feature selection unit 602 and a parameter display unit 604, in accordance with at least one implementation of the subject disclosure. The duct feature selection unit 602 can include portions of the automated duct definition interface 120 of FIG. 1 configured to allow a user to select one or more features of a portion of the duct to be modeled.

In some aspects, the duct feature selection unit 602 can include a duct feature prompt 608 (e.g., "Select a duct end type, end 1:" as illustrated in FIG. 6), 610 (e.g., "Select a duct end type, end 2:"), one or more potential duct features 612, 614, 616, 618, 620, 622, and one or more additional function buttons 640, 642. For example, the potential duct features can include an option for a bell mouth at a duct end (e.g., at 612, 618), no bead at a duct end (e.g., at 614, 620), and a beaded duct end (e.g., at 616, 622). In a particular example, the duct feature selection unit 602 can also include a visual indication of a user's selection between or among the plurality of potential duct features 612, 614, 616, 618, 620, 622.

In some aspects, the duct feature selection unit 602 can be configured to provide a user with additional choices within the duct feature selection unit 602 based on a user's selection within the duct feature selection unit 602. For example, as illustrated in FIG. 6, the user has selected (e.g., in response to the duct feature prompt 608) a beaded end type for end one (e.g., at 616). Because the user selected "Beaded End,"

the duct feature selection unit 602 presents additional feature prompts 624 (e.g., "Index Strip on this end?") and 630 (e.g., Select End 1 Bead Type"). Along with each prompt 624, 630, the duct feature selection unit 602 can present the user with additional features 626, 628, 634, 636, 638 associated with the additional feature prompts 624, 630. For example, the duct feature selection unit 602 can be configured to present the features 626, 628 (e.g., "Yes" and "No") allowing a user to specify whether to include an index strip.

As another example, the duct feature selection unit 602 can be configured to present the features 634, 636, 638 allowing a user to specify a bead type for the beaded end. In a particular example, the features 634, 636, 638 can be associated with one or more duct feature options (e.g., a Type I bead at 634, a Type II bead at 636, a Type III bead at 638, etc.). In a particular implementation, the duct feature selection unit 602 can be configured to present the features 634, 636, 638 through various user-friendly display options (e.g., the drop-down menu 632).

As described above, the duct feature selection unit 602 can be configured to provide additional prompts 624, 630 and features 626, 628, 634, 636, 638 in response to user selection of a particular duct feature 612, 614, 616. The duct feature selection unit 602 can be configured to not display such information if the user makes a different selection. For example, as illustrated in FIG. 6, a user selection of a particular feature 618 (e.g., "Bell Mouth") may not require any additional user input.

Although FIG. 6 illustrates potential duct features 612, 614, 616, 618, 620, 622, 626, 628, 634, 636, 638, more, fewer, and/or different duct features can be present without departing from the scope of the subject disclosure. Further, the availability of particular features can be based on a user's previous selections. For example, the duct feature selection unit 602 can be configured to only present a user with a "bell mouth" option and a "no bead" option if a user's chosen material(s), customer, or other parameter(s) do not allow for ducts with beaded ends.

While FIG. 6 illustrates the potential duct features 612, 614, 616, 618, 620, 622, 626, 628, 634, 636, 638 as various user-friendly input selection types (e.g., button, radio button, drop-down list, etc.), other presentations of the one or more potential duct features 612, 614, 616, 618, 620, 622, 626, 628, 634, 636, 638 can be present without departing from the scope of the subject disclosure. For example, the duct feature selection unit 602 can be configured to illustrate each feature as a separate button, not display any visual representation associated with the feature, or some combination thereof.

In some aspects, the duct feature selection unit 602 can also include one or more additional function buttons 640, 642. The additional function buttons 640, 642 can, for example, allow a user to navigate to other portions of the automated duct definition interface 120 of FIG. 1. For example, the additional function button 640 can include the text "BACK" to indicate that a user can return to a prior user input portion. As an additional example, the additional function button 642 can include the text "CONFIRM" to indicate that the user can save the user's selection of the particular duct feature and continue to an additional user input portion.

In some implementations, the example portion 600 can also include the parameter display unit 604, which can be configured to display a plurality of data fields 520, 522, 524, 526, 528, 654, 656, 658. The plurality of data fields 520, 522, 524, 526, 528, 654, 656, 658 can include visual representation(s) of one or more parameters associated with the duct to be modeled, data associated with such visual representation(s), or some combination thereof. Generally, the data fields 520, 522, 524, 526, 528 correspond to the data fields 520, 522, 524, 526, 528 of FIG. 5. Similarly, the data field 654 can show the data fields 656, 658 as belonging to the sub-heading "End Type Info," the data field 656 can show the chosen duct feature associated with the "End 1 Bead Type," and the data field 656 can show the chosen duct feature associated with the "End 2 Bead Type." Although FIG. 6 illustrates eight data fields, more, fewer, and/or different data fields can be present without departing from the scope of the subject disclosure. For example, as described in more detail below with reference to FIG. 8, an exemplary parameter display unit can display all of the parameters associated with a particular duct to be modeled.

In some aspects, the plurality of data fields 520, 522, 524, 526, 528, 654, 656, 658 can have various logical relationships among the data. In a particular implementation, the parameters display unit 604 can illustrate logical relationships among the plurality of data fields 520, 522, 524, 526, 528, 654, 656, 658. For example, the data fields 522, 524, 526, 528, 654, 656, 658 can be nested underneath the data field 520. The parameters display unit 604 can illustrate this relationship by allowing a user to collapse or expand the "Detail Part Information" category at data field 520 to show or hide the data fields 520, 522, 524, 526, 528, 654, 656, 658. Similarly, the data fields 656, 658 can be nested underneath the data field 654. The parameters display unit 604 can illustrate this relationship by allowing a user to collapse or expand the "End Type Info" category at data field 654 to show or hide the data fields 656, 658.

In some aspects, the plurality of data fields 520, 522, 524, 526, 528, 654, 656, 658 can include data associated with parameters that a user has already specified, has yet to specify, have been generated by the computing device 102 of FIG. 1, other appropriate parameter data, or some combination thereof. In a particular aspect, some or all of the plurality of data fields 520, 522, 524, 526, 528, 654, 656, 658 can be associated with one or more of the duct definition parameters 136 of FIG. 1. For example, the data field 528 showing the "Part Number" can have an associated value (e.g., "1234") previously specified by a user using another unit of the automated duct definition interface 120 or another portion of the duct feature selection unit 602. As another example, the data field 656 showing the "End 1 Bead Type" can display an empty value because the user has not yet specified (or confirmed a selection), a value chosen by the user previously, or a value generated by the computing device 102 of FIG. 1 based on a user's selections.

In the same or alternative particular aspects, one or more of the plurality of data fields 520, 522, 524, 526, 528, 654, 656, 658 can have values that change based on a user's selection in a unit. The parameters display unit 604 can be configured to reflect the user's selection(s) in real-time or near real-time. For example, in the duct feature selection unit 602, a user can select a "Beaded End" feature or a "Bell Mouth" feature for a duct to be modeled through the duct feature selection unit 602. If the user selects "Beaded End," the parameters display unit 604 can be configured to store the value "Beaded End" (e.g., as a duct definition parameter 136 of FIG. 1) and show that selection at data field 656. If the user changes their mind and selects "Bell Mouth," the parameters display unit 604 can be configured to store the value "Bell Mouth" (e.g., as a duct definition parameter 136) and show that selection at data field 654.

In some aspects, the portion 600 of the automated duct definition interface 120 of FIG. 1 can also include a preview unit 606. The preview unit 606 can include a visual representation of a preview 646 of the duct to be modeled. In a particular aspect, the preview 646 can reflect the user's data input through the automated duct definition interface 120. For example, the exemplary preview 646 of FIG. 6 illustrates a straight duct body 648 (e.g., as selected by the user with the straight duct shape 506 of FIG. 5, reflected by the data field 524, etc.), a beaded end 650 at a first end (e.g., as selected by the user with the beaded end feature 616, reflected by the data field 656, etc.), and a bell mouth at a second end 652 (e.g., as selected by the user with the bell mouth feature 618, reflected by the data field 658, etc.).

In some configurations, one or more characteristics of the preview 646 can change based on a user's selection in a unit. The preview unit 606 can be configured to reflect the user's selection(s) in real-time or near real-time. For example, in the portion 600 of the automated duct definition interface 120 of FIG. 1, a user can select a "Beaded End" feature or a "Bell Mouth" feature for a duct to be modeled through the duct feature selection unit 602. If the user selects "Beaded End," the preview unit 606 can be configured to provide a visual representation of a beaded end at a particular end of the duct body 648. If the user changes their mind and selects "Bell Mouth," the preview unit 606 can be configured to provide a visual representation of a bell mouth at the particular end of the duct body 648.

Although FIG. 6 illustrates the preview 646 as being based on user input, the preview 646 can be based on other data without departing from the scope of the subject disclosure. For example, the preview unit 606 can be configured to provide a default preview 646 based on default data prior to any user selection. As another example, the preview unit 606 can be configured to generate the preview 646 based on data received from data sources other than user input (e.g., the duct definition database 114 of FIG. 1).

Figure 7:
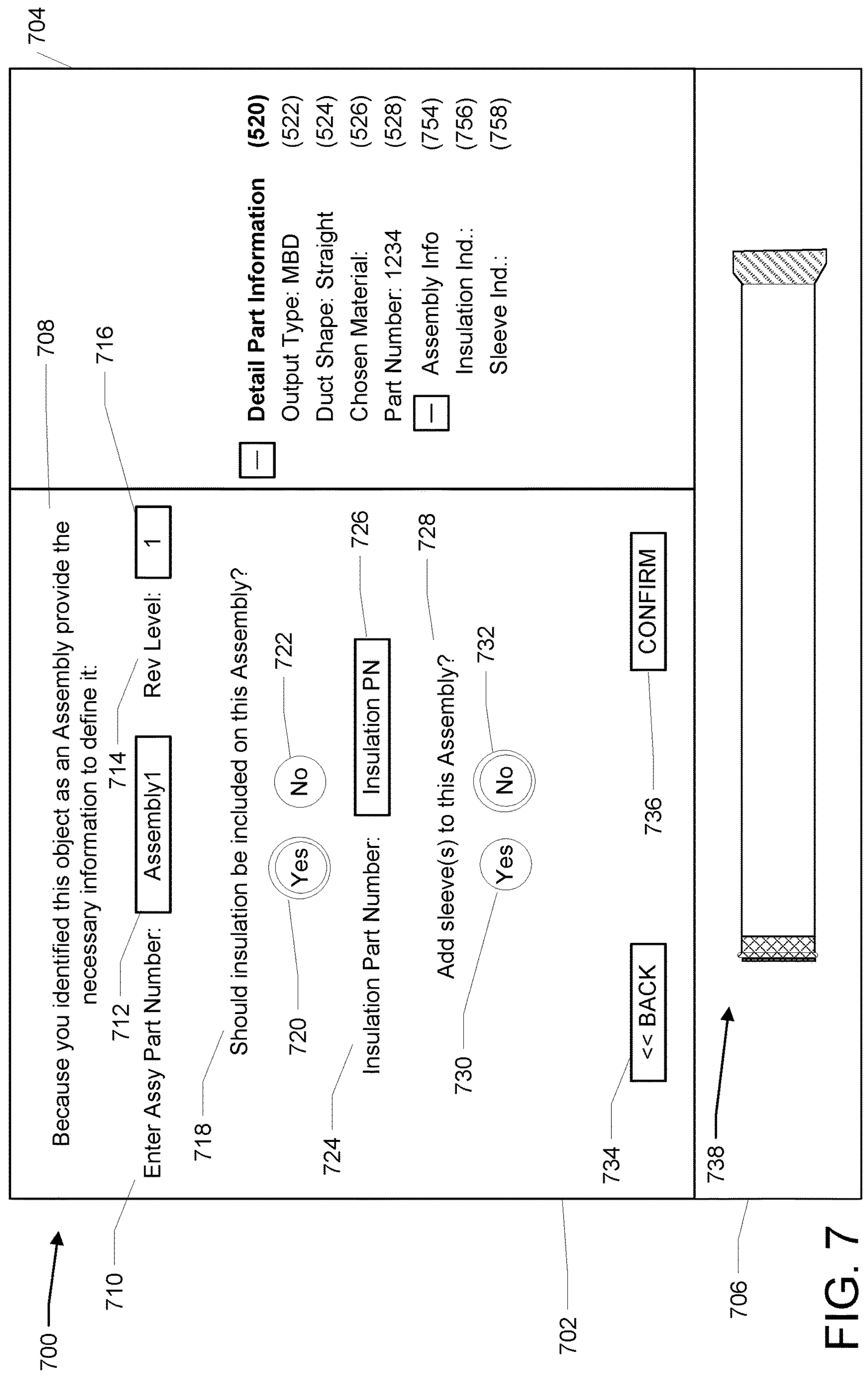
FIG. 7 illustrates an example of a portion of the automated duct definition interface of FIG. 1 including a duct assembly selection unit, a parameter display unit, and a preview unit, in accordance with at least one implementation of the subject disclosure.

FIG. 7 illustrates an example of a portion 700 of the automated duct definition interface 120 of FIG. 1 including the duct assembly selection unit 702, a parameter display unit 704, and a preview unit 706, in accordance with at least one implementation of the subject disclosure. The duct assembly selection unit 702 can include portions of the automated duct definition interface 120 of FIG. 1 configured to allow a user to select one or more assemblies, one or more assembly properties, or some combination thereof for a portion of the duct to be modeled.

In some aspects, the duct assembly selection unit 702 can include a duct assembly prompt 708 (e.g., "Because you identified this object as an Assembly, provide the necessary information to define it:" as illustrated in FIG. 7), 710 (e.g., "Enter Assy Part Number:"), 714 (e.g., "Rev. Level:"), 718 (e.g., "Should insulation be included on this Assembly?"), 728 (e.g., Add sleeve(s) to this Assembly?"); one or more potential duct assembly features 712, 716, 720, 722, 726, 230, 732; and one or more additional function buttons 734, 736. For example, the potential duct assembly features can include an assembly part number (e.g., at 712), a revision number (e.g., at 716), one or more assembly insulation indicators (e.g., at 720, 722), one or more assembly sleeve indicators (e.g., at 730, 732), etc. In a particular example, the duct assembly selection unit 702 can also include a visual indication of a user's selection between or among the one or more assembly insulation indicators, the one or more assembly sleeve indicators, etc.

In some aspects, the duct assembly selection unit 702 can be configured to provide a user with additional choices within the duct assembly selection unit 702 based on a user's selection within the duct assembly selection unit 702. For example, as illustrated in FIG. 7, the user has selected (e.g., in response to the prompt 718) that the assembly should include insulation (e.g., at 720). Because the user selected "Yes," the duct assembly selection unit 702 presents additional assembly prompt 724 (e.g., "Insulation Part Number: "). Along with the prompt 724, the duct assembly selection unit 702 can present the user with additional assembly feature 726 (e.g., "Insulation PN") associated with the prompt 724. The duct assembly selection unit 702 can also be configured to not display the additional assembly features (e.g., additional assembly feature 726) if the user selects an assembly feature that indicates the additional feature is not necessary or desired (e.g., by selecting the assembly feature 722, indicating that the assembly should not include insulation).

Although FIG. 7 illustrates potential duct assembly prompts 708, 710, 714, 718, 724, 728 and potential duct assembly features 712, 716, 720, 722, 726, 730, 732, more, fewer, and/or different duct assembly prompts and/or features can be present without departing from the scope of the subject disclosure. Further, the availability of particular assembly prompts and/or assembly features can be based on a user's previous selections. For example, the duct assembly selection unit 702 can be configured to skip all duct assembly prompts if the user indicates that the duct to be modeled is not an assembly.

While FIG. 7 illustrates the potential duct assembly features 712, 716, 720, 722, 726, 730, 732 as various user-friendly input selection types (e.g., button, radio button, drop-down list, text box, etc.), other presentations of the one or more potential duct assembly features 712, 716, 720, 722, 726, 728, 730, 732 can be present without departing from the scope of the subject disclosure. For example, the duct assembly selection unit 702 can be configured to illustrate each assembly feature as a separate button, not display any visual representation associated with the assembly, or some combination thereof.

In some aspects, the duct assembly selection unit 702 can also include one or more additional function buttons 734, 736. The additional function buttons 734, 736 can, for example, allow a user to navigate to other portions of the automated duct definition interface 120 of FIG. 1. For example, the additional function button 734 can include the text "BACK" to indicate that a user can return to a prior user input portion. As an additional example, the additional function button 736 can include the text "CONFIRM" to indicate that the user can save the user's selection of the particular duct assembly and continue to an additional user input portion.

In some implementations, the example portion 700 can also include the parameter display unit 704, which can be configured to display a plurality of data fields 520, 522, 524, 526, 528, 754, 757, 758. The plurality of data fields 520, 522, 524, 526, 528, 754, 756, 758 can include visual representation(s) of one or more parameters associated with the duct to be modeled, data associated with such visual representation(s), or some combination thereof. Generally, the data fields 520, 522, 524, 526, 528 correspond to the data fields 520, 522, 524, 526, 528 of FIG. 5. Similarly, the data field 754 can show the data fields 756, 758 as belonging to the sub-heading "Assembly Info," the data field 756 can show the chosen duct feature associated with the "Insulation Ind.," and the data field 756 can show the chosen duct feature associated with the "Sleeve Ind." Although FIG. 7 illustrates eight data fields, more, fewer, and/or different data fields can be present without departing from the scope of the subject disclosure. For example, as described in more detail below with reference to FIG. 8, an exemplary parameter display unit can display all of the parameters associated with a particular duct to be modeled.

In some aspects, the plurality of data fields 520, 522, 524, 526, 528, 754, 756, 758 can have various logical relationships among the data. In a particular implementation, the parameters display unit 704 can illustrate logical relationships among the plurality of data fields 520, 522, 524, 526, 528, 754, 756, 758. For example, the data fields 522, 524, 526, 528, 754, 756, 758 can be nested underneath the data field 520. The parameters display unit 704 can illustrate this relationship by allowing a user to collapse or expand the "Detail Part Information" category at data field 520 to show or hide the data fields 520, 522, 524, 526, 528, 754, 756, 758. Similarly, the data fields 756, 758 can be nested underneath the data field 754. The parameters display unit 704 can illustrate this relationship by allowing a user to collapse or expand the "Assembly Info" category at data field 754 to show or hide the data fields 756, 758.

In some aspects, the plurality of data fields 520, 522, 524, 526, 528, 754, 756, 758 can include data associated with parameters that a user has already specified, has yet to specify, have been generated by the computing device 102 of FIG. 1, other appropriate parameter data, or some combination thereof. In a particular aspect, some or all of the plurality of data fields 520, 522, 524, 526, 528, 754, 756, 758 can be associated with one or more of the duct definition parameters 136 of FIG. 1. For example, the data field 528 showing the "Part Number" can have an associated value (e.g., "1234") previously specified by a user using another unit of the automated duct definition interface 120 or another portion of the duct assembly selection unit 702. As another example, the data field 756 showing the "Insulation Ind." can display an empty value because the user has not yet specified (or confirmed a selection) of a value for this feature.

In the same or alternative particular aspects, one or more of the plurality of data fields 520, 522, 524, 526, 528, 754, 756, 758 can have values that change based on a user's selection in a unit. The parameters display unit 704 can be configured to reflect the user's selection(s) in real-time or near real-time. For example, in the duct assembly selection unit 702, a user can indicate whether the assembly should include insulation (e.g., at 720, 722). If the user selects "Yes," the parameters display unit 704 can be configured to store the value "Yes" (e.g., as a duct definition parameter 136 of FIG. 1) and show that selection at data field 756. If the user changes their mind and selects "No," the parameters display unit 704 can be configured to store the value "No" (e.g., as a duct definition parameter 136) and show that selection at data field 754.

In some aspects, the portion 700 of the automated duct definition interface 120 of FIG. 1 can also include a preview unit 706. The preview unit 706 can include a visual representation of a preview 738 of the duct to be modeled. In a particular aspect, the preview 738 can reflect the user's data input through the automated duct definition interface 120. For example, the exemplary preview 738 of FIG. 7 is generally the same as the preview 646 described in more detail above with reference to FIG. 6.

Figure 8:
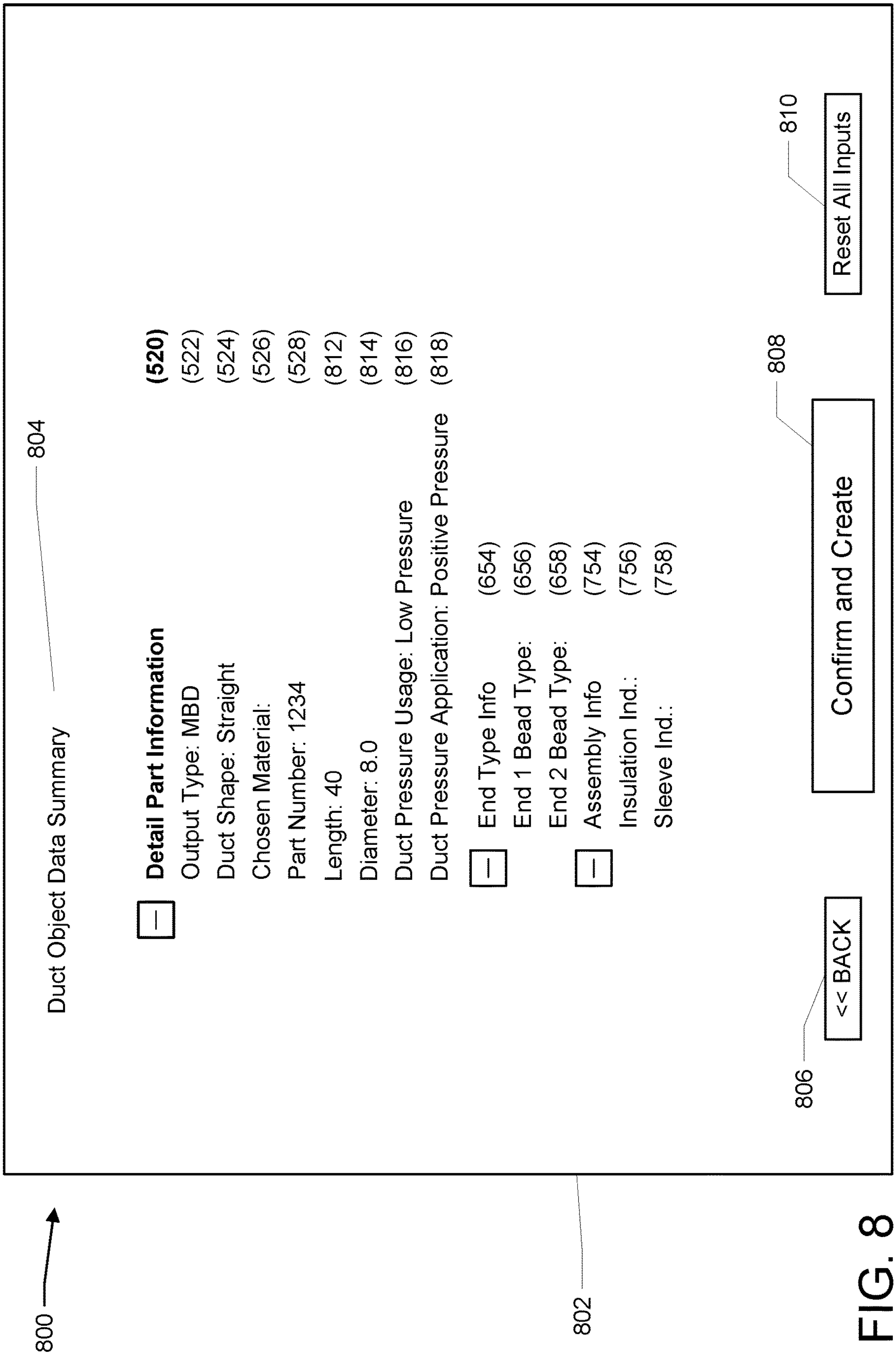
FIG. 8 illustrates an example of a portion of the automated duct definition interface of FIG. 1 including a duct feature summary unit, in accordance with at least one implementation of the subject disclosure.

FIG. 8 illustrates an example of a portion 800 of the automated duct definition interface 120 of FIG. 1 including a duct feature summary unit 802, in accordance with at least one implementation of the subject disclosure. The duct feature summary unit 802 can include portions of the automated duct definition interface 120 of FIG. 1 configured to illustrate a summary of some or all of the features associated with a duct to be modeled. In some aspects, the features illustrated at the duct feature summary unit 802 can be based on user input in one or more other units of the automated duct definition interface 120 of FIG. 1. For example, the duct feature summary unit 802 can include visual representation(s) of some or all of the duct definition parameters 136 of FIG. 1.

In some aspects, the duct feature summary unit 802 can include a duct summary header 804 (e.g., "Duct Object Data Summary" as illustrated in FIG. 8) and one or more duct features at data fields 520, 524, 526, 528, 654, 656, 658, 754, 756, 758, 812, 814, 816, 818. In a particular example, the duct feature summary unit 802 can also include a visual indication of one or more user selections.

In some aspects, the duct feature summary unit 802 can also include one or more additional function buttons 806, 808, 810. The additional function buttons 806, 808, 810 can, for example, allow a user to navigate to other portions of the automated duct definition interface 120 of FIG. 1. For example, the additional function button 806 can include the text "BACK" to indicate that a user can return to a prior user input portion. As an additional example, the additional function button 808 can include the text "Confirm and Create" to indicate that the user can save the user's selection of the particular duct assembly and continue to create the duct model (e.g., the duct model 140 of FIG. 1). As a further example, the additional function button 810 can include the text "Reset All Inputs" to indicate that the user can reset choices and other inputs and return to another portion of the automated duct definition interface 120 of FIG. 1.

In some implementations, the duct feature summary unit 802 can be configured to display a plurality of data fields 520, 522, 524, 526, 528, 654, 656, 658, 754, 756, 758, 812, 814, 816, 818. The plurality of data fields 520, 522, 524, 526, 528, 654, 656, 658, 754, 756, 758, 812, 814, 816, 818 can include visual representation(s) of one or more parameters associated with the duct to be modeled, data associated with such visual representation(s), or some combination thereof. Generally, the data fields 520, 522, 524, 526, 528 correspond to the data fields 520, 522, 524, 526, 528 of FIG. 5; the data fields 654, 656, 658 correspond to the data fields 654, 656, 658 of FIG. 6; and the data fields 754, 756, 758 correspond to the data fields 754, 756, 758 of FIG. 7.

In some aspects, the data fields 812, 814, 816, 818 can show data fields associated with one or more duct features that may or may not have been displayed in other portions of the automated duct definition interface 120 of FIG. 1. For example, the data field 812 can show the chosen length "40" of the duct to be modeled, the data field 814 can show the chosen diameter "8.0" of the duct to be modeled, the data field 816 can show the selected "Low Pressure" for the duct pressure usage, and the data field 818 can show the selected "Positive Pressure" for the duct pressure application. Although FIG. 8 illustrates fifteen data fields, more, fewer, and/or different data fields can be present without departing from the scope of the subject disclosure. For example, the duct feature summary unit 802 can show data fields associated with all of the duct definition parameters 136 of FIG. 1.

In some aspects, the plurality of data fields 520, 522, 524, 526, 528, 654, 656, 658, 754, 756, 758, 812, 814, 816, 818 can have various logical relationships among the data. In a particular implementation, the duct feature summary unit 802 can illustrate logical relationships among the plurality of data fields 520, 522, 524, 526, 528, 654, 656, 658, 754, 756, 758, 812, 814, 816, 818. For example, the data fields 522, 524, 526, 528, 654, 656, 658, 754, 756, 758, 812, 814, 816,

818 can be nested underneath the data field 520. The duct feature summary unit 802 can illustrate this relationship by allowing a user to collapse or expand the "Detail Part Information" category at data field 520 to show or hide the data fields 522, 524, 526, 528, 654, 656, 658, 754, 756, 758, 812, 814, 816, 818. Similarly, the data fields 656, 658 can be nested underneath the data field 654, and the data fields 756, 758 can be nested underneath the data field 754. The duct feature summary unit 802 can illustrate these relationships by allowing a user to collapse or expand the "End Type Info" category at data field 654 to show or hide the data fields 656, 658 and/or collapse or expand the "Assembly Info" category at data field 754 to show or hide the data fields 756, 758.

In some aspects, the plurality of data fields 520, 522, 524, 526, 528, 654, 656, 658, 754, 756, 758, 812, 814, 816, 818 can include data associated with parameters that a user has already specified, has yet to specify, have been generated by the computing device 102 of FIG. 1, other appropriate parameter data, or some combination thereof.

Although FIGS. 1-8 illustrates certain operations occurring within various components of the system 100 of FIG. 1, such operations can be performed by other components of the system 100 without departing from the scope of the subject disclosure. For example, the operations performed by the three-dimensional representation generator 126 and/or the two-dimensional representation generator 128 can be combined into a single duct representation generator. As another example, the operations performed by the various units described in more detail above with reference to FIGS. 1 and 5-8 can be consolidated, distributed, or some combination thereof.

Further, although FIGS. 1-8 illustrate the various components of the system 100 as separate, other configurations are possible without departing from the scope of the subject disclosure. For example, the automated duct definition interface 120 of FIG. 1 can be decentralized and located at an external server communicably coupled to the computing device 102. As another example, the duct definition parameters 136 can be located at the duct definition database 114. As a further example, the various units described in more detail above with reference to FIGS. 1 and 5-8 can be consolidated, distributed, or some combination thereof between or among various other units of the automated duct definition interface 120 of FIG. 1.

Figure 9:
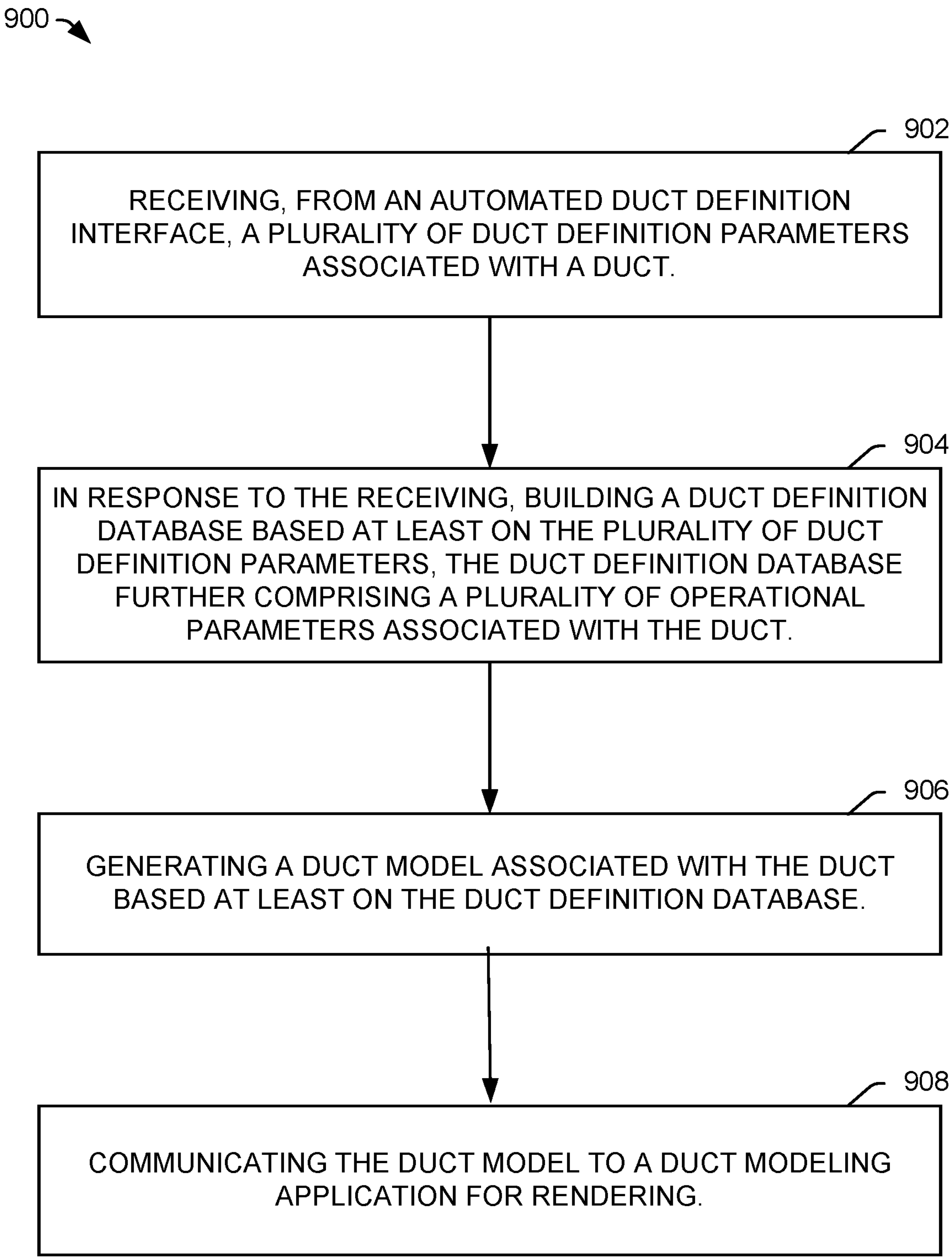
FIG. 9 is a flow chart of an example of a method for providing improved duct modeling using an improved duct definition interface, in accordance with the subject disclosure.

FIG. 9 is a flow chart of an example of a method 900 for providing improved duct modeling using an improved duct definition interface, in accordance with the subject disclosure. The method 900 can be initiated, performed, or controlled by one or more processors executing instructions, such as by the processor(s) 106 of FIG. 1 executing instructions from the memory 108.

In some implementations, the method 900 includes, at 902, receiving, from an automated duct definition interface, a plurality of duct definition parameters associated with a duct. For example, the processor(s) 106 of FIG. 1 can receive, from the automated duct definition interface 120, the duct definition parameters 136.

In the example of FIG. 9, the method 900 also includes, at 904, in response to the receiving, building a duct definition database based at least on the plurality of duct definition parameters, the duct definition database further comprising a plurality of operational parameters associated with the duct. For example, the processor(s) 106 of FIG. 1 can automatically build the duct definition database 114 based at least on the duct definition parameters 136, the duct definition database 114 including the operational parameters 118.

In the example of FIG. 9, the method 900 also includes, at 906, generating a duct model associated with the duct based at least on the duct definition database. For example, the processor(s) 106 of FIG. 1 can generate the duct model 140 based at least on the duct definition database 114.

In the example of FIG. 9, the method 900 also includes, at 908, communicating the duct model to a duct modeling application for rendering. For example, the processor(s) of FIG. 1 can communicate the duct model 140 to the duct modeling application 104 for rendering.

Although the method 900 is illustrated as including a certain number of steps, more, fewer, and/or different steps can be included in the method 900 without departing from the scope of the subject disclosure. For example, the method 900 can vary depending on the count and variety of ducts to be modeled. For example, the method 900 can automatically build the duct definition database for a plurality of ducts to be modeled based on multiple, separate sets of duct definition parameters received from the automated duct definition interface.

Figure 10:
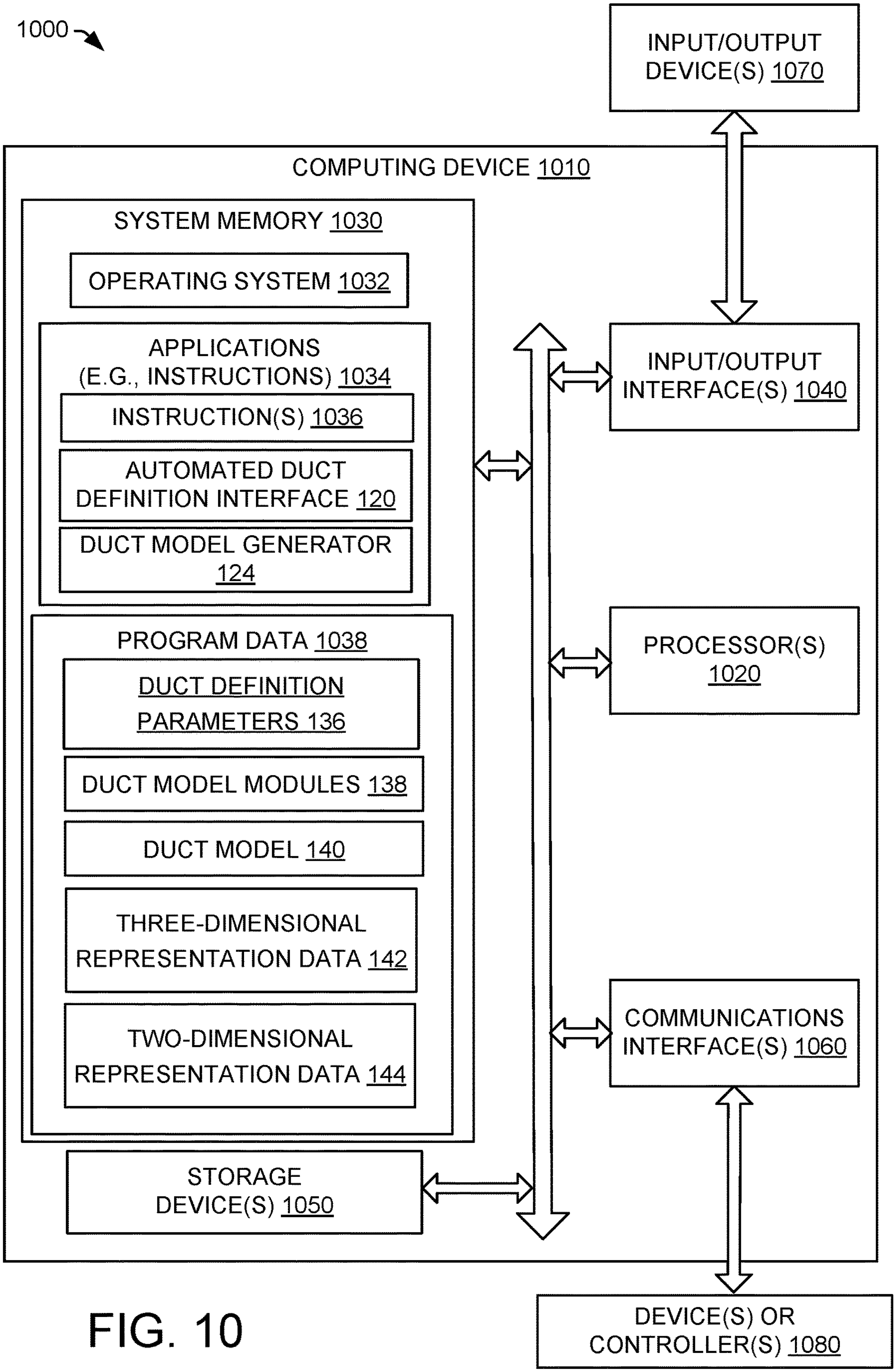
FIG. 10 is a block diagram of a computing environment including a computing device configured to support aspects of computer-implemented methods and computer-executable program instructions (or code) according to the subject disclosure.

FIG. 10 is a block diagram of a computing environment 1000 including a computing device 1010 configured to support aspects of computer-implemented methods and computer-executable program instructions (or code) according to the subject disclosure. For example, the computing device 1010, or portions thereof, is configured to execute instructions to initiate, perform, or control one or more operations described in more detail above with reference to FIGS. 1-9. In a particular aspect, the computing device 1010 can include the computing device 102 of FIG. 1, the duct modeling application 104 of FIG. 1, the duct definition database 114 of FIG. 1, one or more servers, one or more virtual devices, or a combination thereof.

The computing device 1010 includes one or more processors 1020. In a particular aspect, the processor(s) 1020 correspond to the processor(s) 106 of FIG. 1. The processor (s) 1020 are configured to communicate with system memory 1030, one or more storage devices 1050, one or more input/output interfaces 1040, one or more communications interfaces 1060, or any combination thereof. The system memory 1030 includes volatile memory devices (e.g., random access memory (RAM) devices), nonvolatile memory devices (e.g., read-only memory (ROM) devices, programmable read-only memory, and flash memory), or both. The system memory 1030 stores an operating system 1032, which can include a basic input/output system for booting the computing device 1010 as well as a full operating system to enable the computing device 1010 to interact with users, other programs, and other devices. The system memory 1030 stores system (program) data 1038, such the duct definition parameters 136, the duct model modules 138, the duct model 140, the three-dimensional representation data 142, the two-dimensional representation data 144 of FIG. 1, or a combination thereof.

The system memory 1030 includes one or more applications 1034 (e.g., sets of instructions) executable by the processor(s) 1020. As an example, the one or more applications 1034 include the instructions 1036 executable by the processor(s) 1020 to initiate, control, or perform one or more operations described with reference to FIGS. 1-9. To illustrate, the one or more applications 1034 include the instructions 1036 executable by the processor(s) 1020 to initiate, control, or perform one or more operations described with reference to the automated duct definition interface 120, the duct model generator 124 of FIG. 1, or some combination thereof.

In a particular implementation, the system memory 1030 includes a non-transitory, computer readable medium (e.g., a computer-readable storage device) storing the instructions 1036 that, when executed by the processor(s) 1020, cause the processor(s) 1020 to initiate, perform, or control operations for improved duct modeling using an improved duct definition interface. The operations include receiving, from an automated duct definition interface, a plurality of duct definition parameters associated with a duct. The operations also include automatically (e.g., in response to the receiving) building a duct definition database based at least on the plurality of duct definition parameters, the duct definition database further comprising a plurality of operational parameters associated with the duct. The operations also include generating a duct model associated with the duct based at least on the duct definition database. The operations also include communicating the duct model to a duct modeling application for rendering.

The one or more storage devices 1050 include nonvolatile storage devices, such as magnetic disks, optical disks, or flash memory devices. In a particular example, the storage devices 1050 include both removable and non-removable memory devices. The storage devices 1050 are configured to store an operating system, images of operating systems, applications (e.g., one or more of the applications 1034), and program data (e.g., the program data 1038). In a particular aspect, the system memory 1030, the storage devices 1050, or both, include tangible computer-readable media. In a particular aspect, one or more of the storage devices 1050 are external to the computing device 1010. In a particular aspect, the storage device(s) 1050 can include the duct definition database 114 of FIG. 1.

The one or more input/output interfaces 1040 enable the computing device 1010 to communicate with one or more input/output devices 1070 to facilitate user interaction. For example, the one or more input/output interfaces 1040 can include a display interface, an input interface, or both. For example, the input/output interface 1040 is adapted to receive input from a user, to receive input from another computing device, or a combination thereof. In some implementations, the input/output interface 1040 conforms to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces ("IEEE" is a registered trademark of The Institute of Electrical and Electronics Engineers, Inc. of Piscataway, New Jersey). In some implementations, the input/output device(s) 1070 include one or more user interface devices and displays, including some combination of buttons, keyboards, pointing devices, displays, speakers, microphones, touch screens, and other devices.

The processor(s) 1020 are configured to communicate with devices or controllers 1080 via the one or more communications interfaces 1060. For example, the one or more communications interfaces 1060 can include a network interface. The devices or controllers 1080 can include, for example, the duct modeling application 104 of FIG. 1.

In some implementations, a non-transitory, computer readable medium (e.g., a computer-readable storage device) stores instructions that, when executed by one or more processors, cause the one or more processors to initiate, perform, or control operations to perform part of or all the functionality described above. For example, the instructions can be executable to implement one or more of the operations or methods of FIGS. 1-9. In some implementations, part or all of one or more of the operations or methods of FIGS. 1-9 can be implemented by one or more processors (e.g., one or more central processing units (CPUs), one or more graphics processing units (GPUs), one or more digital signal processors (DSPs)) executing instructions, by dedicated hardware circuitry, or any combination thereof.

The illustrations of the examples described herein are intended to provide a general understanding of the structure of the various implementations. The illustrations are not intended to serve as a complete description of all of the elements and features of apparatus and systems that utilize the structures or methods described herein. Many other implementations can be apparent to those of skill in the art upon reviewing the disclosure. Other implementations can be utilized and derived from the disclosure, such that structural and logical substitutions and changes can be made without departing from the scope of the disclosure. For example, method operations can be performed in a different order than shown in the figures or one or more method operations can be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results can be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features can be grouped together or described in a single implementation for the purpose of streamlining the disclosure. Examples described above illustrate but do not limit the disclosure. It should also be understood that numerous modifications and variations are possible in accordance with the principles of the subject disclosure. As the following claims reflect, the claimed subject matter can be directed to less than all of the features of any of the disclosed examples. Accordingly, the scope of the disclosure is defined by the following claims and their equivalents.

Further, the disclosure comprises embodiments according to the following examples:

According to Example 1, a method includes receiving, from an automated duct definition interface, a plurality of duct definition parameters associated with a duct; in response to the receiving, building a duct definition database based at least on the plurality of duct definition parameters, the duct definition database further comprising a plurality of operational parameters associated with the duct; generating a duct model associated with the duct based at least on the duct definition database; and communicating the duct model to a duct modeling application for rendering.

Example 2 includes the method of Example 1, wherein the plurality of operational parameters comprises one or more material type parameters.

Example 3 includes the method of Example 1 or Example 2, wherein the plurality of operational parameters comprises one or more manufacturing processing parameters.

Example 4 includes the method of any of Examples 1 to 3, wherein the plurality of operational parameters comprises one or more shipping parameters.

Example 5 includes the method of any of Examples 1 to 4. wherein the duct model comprises a model-based definition of the duct.

Example 6 includes the method of any of Examples 1 to 5, where the method further includes selecting one or more duct model modules from a plurality of duct model modules, each of the plurality of duct model modules associated with one or more features of the duct; and wherein generating the duct model comprises generating the duct model using the one or more duct model modules.

Example 7 includes the method of Example 6, wherein selecting the one or more duct model modules from the plurality of duct model modules is based at least on the plurality of duct definition parameters.

Example 8 includes the method of any of Examples 1 to 7, wherein generating the duct model comprises storing one or more of the plurality of operational parameters as metadata of the duct model.

Example 9 includes the method of any of Examples 1 to 8, wherein the duct model comprises a three-dimensional representation.

Example 10 includes the method of any of Examples 1 to 9, wherein the duct model comprises a three-dimensional representation of the duct and a two-dimensional representation of the duct.

Example 11 includes the method of any of Examples 1 to 10, wherein generating the duct model comprises generating a three-dimensional representation of the duct and generating, based at least on the three-dimensional representation, a two-dimensional representation of the duct.

Example 12 includes the method of Example 11, wherein generating the two-dimensional representation comprises analyzing the three-dimensional representation to determine one or more bends in the duct.

Example 13 includes the method of Example 12, wherein analyzing the three-dimensional representation to determine one or more bends in the duct comprises an iterative bend identification process, the iterative bend identification process includes generating at least three points along a portion of a centerline of the three-dimensional representation; determining whether the at least three points are colinear; if the at least three points are not colinear, identifying a location within the three-dimensional representation of the duct where a bend exists; and repeating the iterative bend identification process along a length of the centerline.

Example 14 includes the method of Example 13, wherein generating the two-dimensional representation of the duct comprises generating a front view of the three-dimensional representation, wherein generating the front view includes determining a first vector extending from a first point proximate a first end of the centerline along a first substantially straight portion of the centerline, determining a second vector extending from the first point to a second point along the bend, and determining a viewing angle based at least on a cross product of the first vector and the second vector, wherein the front view corresponds to a view of the three-dimensional representation from the viewing angle.

Example 15 includes the method of Example 14, wherein generating the two-dimensional representation further includes determining a third vector extending along a second substantially straight portion of the centerline on an opposite side of the bend from the first point and identifying a bend coordinate based on an intersection between the first vector and the third vector.

Example 16 includes the method of Example 15, wherein generating the two-dimensional representation further comprises adding a dimension annotation indicating a distance between the first point and the bend coordinate.

Example 17 includes the method of any of Examples 11 to 16, wherein generating the two-dimensional representation comprises automatically numbering one or more coordinate points.

Example 18 includes the method of any of Examples 11 to 17, wherein generating the two-dimensional representation comprises adding an annotative text.

Example 19 includes the method of any of Examples 1 to 18, wherein the automated duct definition interface comprises an assembly selection unit, and wherein the plurality of duct definition parameters comprises one or more assembly selection parameters based at least on user input to the assembly selection unit.

Example 20 includes the method of any of Examples 1 to 19, wherein the automated duct definition interface comprises a duct shape selection unit, and wherein the plurality of duct definition parameters comprises one or more shape selection parameters based at least on user input to the duct shape selection unit.

Example 21 includes the method of Example 20, wherein the duct shape selection unit is configured to allow a user to define a centerline associated with a curved duct.

Example 22 includes the method of any of Examples 1 to 21, wherein the automated duct definition interface comprises a dimension selection unit, and wherein the plurality of duct definition parameters comprises one or more dimension selection parameters based at least on user input to the dimension selection unit.

Example 23 includes the method of any of Examples 1 to 22, wherein the automated duct definition interface comprises a duct pressure selection unit, and wherein the plurality of duct definition parameters comprises one or more pressure selection parameters based at least on user input to the duct pressure selection unit.

Example 24 includes the method of any of Examples 1 to 23, wherein the automated duct definition interface comprises a duct material selection unit, and wherein the plurality of duct definition parameters comprises one or more material selection parameters based at least on user input to the duct material selection unit.

Example 25 includes the method of any of Examples 1 to 24, wherein the automated duct definition interface comprises a duct feature selection unit, and wherein the plurality of duct definition parameters comprises one or more feature selection parameters based at least on user input to the duct feature selection unit.

Example 26 includes the method of Example 25, wherein the duct feature selection unit is configured to allow a user to select from among a plurality of duct end types.

Example 27 includes the method of Example 25 or Example 26, wherein the duct feature selection unit is configured to allow a user to select from among a plurality of couplings.

Example 28 includes the method of any of Examples 25 to 27, wherein the duct feature selection unit is configured to allow a user to select from among a plurality of test port types.

Example 29 includes the method of any of Examples 1 to 28, wherein the automated duct definition interface is configured to automatically limit user choices within the automated duct definition interface based at least on prior user selection within the automated duct definition interface.

Example 30 includes the method of any of Examples 1 to 29, wherein the automated duct definition interface is configured to generate a preview of the duct based at least on a user's selection within the automated duct definition interface.

According to Example 31, a device includes means for receiving, from an automated duct definition interface, a plurality of duct definition parameters associated with a duct. The device also includes means for automatically (e.g., in response to the receiving) building a duct definition database based at least on the plurality of duct definition parameters, the duct definition database further comprising a plurality of operational parameters associated with the duct. The device also includes means for generating a duct model associated with the duct based at least on the duct definition database. The device also includes means for communicating the duct model to a duct modeling application for rendering.

Example 32 includes the device of Example 31, wherein the plurality of operational parameters comprises one or more material type parameters.

Example 33 includes the device of Example 31 or Example 32, wherein the plurality of operational parameters comprises one or more manufacturing processing parameters.

Example 34 includes the device of any of Examples 31 to 33, wherein the plurality of operational parameters comprises one or more shipping parameters.

Example 35 includes the device of any of Examples 31 to 34, wherein the duct model comprises a model-based definition of the duct.

Example 36 includes the device of any of Examples 31 to 35, wherein the device further includes means for selecting one or more duct model modules from a plurality of duct model modules, each of the plurality of duct model modules associated with one or more features of the duct; and wherein generating the duct model comprises generating the duct model using the one or more duct model modules.

Example 37 includes the device of Example 36, wherein selecting the one or more duct model modules from the plurality of duct model modules is based at least on the plurality of duct definition parameters.

Example 38 includes the device of any of Examples 31 to 37, wherein generating the duct model comprises storing one or more of the plurality of operational parameters as metadata of the duct model.

Example 39 includes the device of any of Examples 31 to 38m wherein the duct model comprises a three-dimensional representation.

Example 40 includes the device of any of Examples 31 to 39, wherein the duct model comprises a three-dimensional representation of the duct and a two-dimensional representation of the duct.

Example 41 includes the device of any of Examples 31 to 40, wherein generating the duct model comprises generating a three-dimensional representation of the duct and generating, based at least on the three-dimensional representation, a two-dimensional representation of the duct.

Example 42 includes the device of Example 41, wherein generating the two-dimensional representation comprises analyzing the three-dimensional representation to determine one or more bends in the duct.

Example 43 includes the device of Example 42, wherein analyzing the three-dimensional representation to determine one or more bends in the duct comprises an iterative bend identification process, the iterative bend identification process includes generating at least three points along a portion of a centerline of the three-dimensional representation; determining whether the at least three points are colinear; if the at least three points are not colinear, identifying a location within the three-dimensional representation of the duct where a bend exists; and repeating the iterative bend identification process along a length of the bend.

Example 44 includes the device of Example 43, wherein generating the two-dimensional representation of the duct comprises generating a front view of the three-dimensional representation, wherein generating the front view includes determining a first vector extending from a first point proximate a first end of the centerline along a first substantially straight portion of the centerline, determining a second vector extending from the first point to a second point along the bend, and determining a viewing angle based at least on a cross product of the first vector and the second vector, wherein the front view corresponds to a view of the three-dimensional representation from the viewing angle.

Example 45 includes the device of Example 44, wherein generating the two-dimensional representation further includes determining a third vector extending along a second substantially straight portion of the centerline on an opposite side of the bend from the first point; and identifying a bend coordinate based on an intersection between the first vector and the third vector.

Example 46 includes the device of Example 45, wherein generating the two-dimensional representation further comprises adding a dimension annotation indicating a distance between the first point and the bend coordinate.

Example 47 includes the device of any of Examples 41 to 46, wherein generating the two-dimensional representation comprises automatically numbering one or more coordinate points.

Example 48 includes the device of any of Examples 41 to 47, wherein generating the two-dimensional representation comprises adding an annotative text.

Example 49 includes the device of any of Examples 31 to 48, wherein the automated duct definition interface comprises an assembly selection unit, and wherein the plurality of duct definition parameters comprises one or more assembly selection parameters based at least on user input to the assembly selection unit.

Example 50 includes the device of any of Examples 31 to 49, wherein the automated duct definition interface comprises a duct shape selection unit, and wherein the plurality of duct definition parameters comprises one or more shape selection parameters based at least on user input to the duct shape selection unit.

Example 51 includes the device of Example 50, wherein the duct shape selection unit is configured to allow a user to define a centerline associated with a curved duct.

Example 52 includes the device of Example 51, wherein the automated duct definition interface comprises a dimension selection unit, and wherein the plurality of duct definition parameters comprises one or more dimension selection parameters based at least on user input to the dimension selection unit.

Example 53 includes the device of any of Examples 31 to 52, wherein the automated duct definition interface comprises a duct pressure selection unit, and wherein the plurality of duct definition parameters comprises one or more pressure selection parameters based at least on user input to the duct pressure selection unit.

Example 54 includes the device of any of Examples 31 to 53, wherein the automated duct definition interface comprises a duct material selection unit, and wherein the plurality of duct definition parameters comprises one or more material selection parameters based at least on user input to the duct material selection unit.

Example 55 includes the device of any of Examples 31 to 54, wherein the automated duct definition interface comprises a duct feature selection unit, and wherein the plurality of duct definition parameters comprises one or more feature selection parameters based at least on user input to the duct feature selection unit.

Example 56 includes the device of Example 55, wherein the duct feature selection unit is configured to allow a user to select from among a plurality of duct end types.

Example 57 includes the device of Example 55 or Example 56, wherein the duct feature selection unit is configured to allow a user to select from among a plurality of couplings.

Example 58 includes the device of any of Examples 55 to 57, wherein the duct feature selection unit is configured to allow a user to select from among a plurality of test port types.

Example 59 includes the device of any of Examples 31 to 58, wherein the automated duct definition interface is configured to automatically limit user choices within the automated duct definition interface based at least on prior user selection within the automated duct definition interface.

Example 60 includes the device of any of Examples 31 to 59, wherein the automated duct definition interface is configured to generate a preview of the duct based at least on a user's selection within the automated duct definition interface.

According to Example 61, a non-transient, computer-readable medium stores instructions executable by one or more processors to perform operations that include receiving, from an automated duct definition interface, a plurality of duct definition parameters associated with a duct. The operations also include, in response to the receiving, building a duct definition database based at least on the plurality of duct definition parameters, the duct definition database further comprising a plurality of operational parameters associated with the duct. The operations also include generating a duct model associated with the duct based at least on the duct definition database. The operations also include communicating the duct model to a duct modeling application for rendering.

Example 62 includes the non-transient, computer-readable medium of Example 61, wherein the plurality of operational parameters comprises one or more material type parameters.

Example 63 includes the non-transient, computer-readable medium of Example 61 or Example 62, wherein the plurality of operational parameters comprises one or more manufacturing processing parameters.

Example 64 includes the non-transient, computer-readable medium of any of Examples 61 to 63, wherein the plurality of operational parameters comprises one or more shipping parameters.

Example 65 includes the non-transient, computer-readable medium of any of Examples 61 to 64, wherein the duct model comprises a model-based definition of the duct.

Example 66 includes the non-transient, computer-readable medium of any of Examples 61 to 65, wherein the operations further include selecting one or more duct model modules from a plurality of duct model modules, each of the plurality of duct model modules associated with one or more features of the duct; and wherein generating the duct model comprises generating the duct model using the one or more duct model modules.

Example 67 includes the non-transient, computer-readable medium of Example 66, wherein selecting the one or more duct model modules from the plurality of duct model modules is based at least on the plurality of duct definition parameters.

Example 68 includes the non-transient, computer-readable medium of any of Examples 61 to 67, wherein generating the duct model comprises storing one or more of the plurality of operational parameters as metadata of the duct model.

Example 69 includes the non-transient, computer-readable medium of any of Examples 61 to 68, wherein the duct model comprises a three-dimensional representation.

Example 70 includes the non-transient, computer-readable medium of any of Examples 61 to 69, wherein the duct model comprises a three-dimensional representation of the duct and a two-dimensional representation of the duct.

Example 71 includes the non-transient, computer-readable medium of any of Examples 61 to 70, wherein generating the duct model comprises generating a three-dimensional representation of the duct and generating, based at least on the three-dimensional representation, a two-dimensional representation of the duct.

Example 72 includes the non-transient, computer-readable medium of Example 71, wherein generating the two-dimensional representation comprises analyzing the three-dimensional representation to determine one or more bends in the duct.

Example 73 includes the non-transient, computer-readable medium of Example 72, wherein analyzing the three-dimensional representation to determine one or more bends in the duct comprises an iterative bend identification process, the iterative bend identification process includes generating at least three points along a portion of a centerline of the three-dimensional representation; determining whether the at least three points are colinear; if the at least three points are not colinear, identifying a location within the three-dimensional representation of the duct where a bend exists; and repeating the iterative bend identification process along a length of the bend.

Example 74 includes the non-transient, computer-readable medium of Example 73, wherein generating the two-dimensional representation of the duct comprises generating a front view of the three-dimensional representation, wherein generating the front view includes determining a first vector extending from a first point proximate a first end of the centerline along a first substantially straight portion of the centerline, determining a second vector extending from the first point to a second point along the bend, and determining a viewing angle based at least on a cross product of the first vector and the second vector, wherein the front view corresponds to a view of the three-dimensional representation from the viewing angle.

Example 75 includes the non-transient, computer-readable medium of Example 74, wherein generating the two-dimensional representation further includes determining a third vector extending along a second substantially straight portion of the centerline on an opposite side of the bend from the first point; and identifying a bend coordinate based on an intersection between the first vector and the third vector.

Example 76 includes the non-transient, computer-readable medium of Example 75, wherein generating the two-dimensional representation further comprises adding a dimension annotation indicating a distance between the first point and the bend coordinate.

Example 77 includes the non-transient, computer-readable medium of any of Examples 71 to 76, wherein generating the two-dimensional representation comprises automatically numbering one or more coordinate points.

Example 78 includes the non-transient, computer-readable medium of any of Examples 71 to 77, wherein generating the two-dimensional representation comprises adding an annotative text.

Example 79 includes the non-transient, computer-readable medium of any of Examples 61 to 78, wherein the automated duct definition interface comprises an assembly selection unit, and wherein the plurality of duct definition parameters comprises one or more assembly selection parameters based at least on user input to the assembly selection unit.

Example 80 includes the non-transient, computer-readable medium of any of Examples 61 to 79, wherein the automated duct definition interface comprises a duct shape selection unit, and wherein the plurality of duct definition parameters comprises one or more shape selection parameters based at least on user input to the duct shape selection unit.

Example 81 includes the non-transient, computer-readable medium of Example 80, wherein the duct shape selection unit is configured to allow a user to define a centerline associated with a curved duct.

Example 82 includes the non-transient, computer-readable medium of any of Examples 61 to 81, wherein the automated duct definition interface comprises a dimension selection unit, and wherein the plurality of duct definition parameters comprises one or more dimension selection parameters based at least on user input to the dimension selection unit.

Example 83 includes the non-transient, computer-readable medium of any of Examples 61 to 82, wherein the automated duct definition interface comprises a duct pressure selection unit, and wherein the plurality of duct definition parameters comprises one or more pressure selection parameters based at least on user input to the duct pressure selection unit.

Example 84 includes the non-transient, computer-readable medium of any of Examples 61 to 83, wherein the automated duct definition interface comprises a duct material selection unit, and wherein the plurality of duct definition parameters comprises one or more material selection parameters based at least on user input to the duct material selection unit.

Example 85 includes the non-transient, computer-readable medium of any of Examples 61 to 84, wherein the automated duct definition interface comprises a duct feature selection unit, and wherein the plurality of duct definition parameters comprises one or more feature selection parameters based at least on user input to the duct feature selection unit.

Example 86 includes the non-transient, computer-readable medium of Example 85, wherein the duct feature selection unit is configured to allow a user to select from among a plurality of duct end types.

Example 87 includes the non-transient, computer-readable medium of Example 85 or Example 86, wherein the duct feature selection unit is configured to allow a user to select from among a plurality of couplings.

Example 88 includes the non-transient, computer-readable medium of any of Examples 85 to 87, wherein the duct feature selection unit is configured to allow a user to select from among a plurality of test port types.

Example 89 includes the non-transient, computer-readable medium of any of Examples 61 to 88, wherein the automated duct definition interface is configured to automatically limit user choices within the automated duct definition interface based at least on prior user selection within the automated duct definition interface.

Example 90 includes the non-transient, computer-readable medium of any of Examples 61 to 89, wherein the automated duct definition interface is configured to generate a preview of the duct based at least on a user's selection within the automated duct definition interface.

According to Example 91, a system includes a memory configured to store instructions; and one or more processors configured to receive, from an automated duct definition interface, a plurality of duct definition parameters associated with a duct; automatically build a duct definition database based at least on the plurality of duct definition parameters, the duct definition database further comprising a plurality of operational parameters associated with the duct; generate a duct model associated with the duct based at least on the duct definition database; and communicate the duct model to a duct modeling application for rendering.

Example 92 includes the system of Example 91, wherein the plurality of operational parameters comprises one or more material type parameters.

Example 93 includes the system of Example 91 or Example 92, wherein the plurality of operational parameters comprises one or more manufacturing processing parameters.

Example 94 includes the system of any of Examples 91 to 93, wherein the plurality of operational parameters comprises one or more shipping parameters.

Example 95 includes the system of any of Examples 91 to 94, wherein the duct model comprises a model-based definition of the duct.

Example 96 includes the system of any of Examples 91 to 95, wherein the one or more processors are further configured to select one or more duct model modules from a plurality of duct model modules, each of the plurality of duct model modules associated with one or more features of the duct; and wherein the one or more processors are configured to generate the duct model including generating the duct model using the one or more duct model modules.

Example 97 includes the system of Example 96, wherein the one or more processors are configured to select the one or more duct model modules from the plurality of duct model modules based at least on the plurality of duct definition parameters.

Example 98 includes the system of any of Examples 91 to 97, wherein the one or more processors are configured to generate the duct model including storing one or more of the plurality of operational parameters as metadata of the duct model.

Example 99 includes the system of any of Examples 91 to 98, wherein the duct model comprises a three-dimensional representation.

Example 100 includes the system of any of Examples 91 to 99, wherein the duct model comprises a three-dimensional representation of the duct and a two-dimensional representation of the duct.

Example 101 includes the system of any of Examples 91 to 100, wherein the one or more processors are configured to generate the duct model including generating a three-dimensional representation of the duct and generating, based at least on the three-dimensional representation, a two-dimensional representation of the duct.

Example 102 includes the system of Example 101, wherein the one or more processors are configured to generate the two-dimensional representation including analyzing the three-dimensional representation to determine one or more bends in the duct.

Example 103 includes the system of Example 102, wherein the one or more processors are configured to analyze the three-dimensional representation to determine one or more bends in the duct through an iterative bend identification process, the iterative bend identification process includes generating at least three points along a portion of a centerline of the three-dimensional representation; determining whether the at least three points are colinear; if the at least three points are not colinear, identifying a location within the three-dimensional representation of the duct where a bend exists; and repeating the iterative bend identification process along a length of the bend.

Example 104 includes the system of Example 103, wherein the one or more processors are configured to generate the two-dimensional representation of the duct including generating a front view of the three-dimensional representation, wherein generating the front view includes determining a first vector extending from a first point proximate a first end of the centerline along a first substantially straight portion of the centerline, determining a second vector extending from the first point to a second point along the bend, and determining a viewing angle based at least on a cross product of the first vector and the second vector, wherein the front view corresponds to a view of the three-dimensional representation from the viewing angle.

Example 105 includes the system of Example 104, wherein the one or more processors are configured to generate the two-dimensional representation including determining a third vector extending along a second substantially straight portion of the centerline on an opposite side of the bend from the first point; and identifying a bend coordinate based on an intersection between the first vector and the third vector.

Example 106 includes the system of Example 105, wherein the one or more processors are configured to generate the two-dimensional representation including adding a dimension annotation indicating a distance between the first point and the bend coordinate.

Example 107 includes the system of any of Examples 101 to 106, wherein the one or more processors are configured to generate the two-dimensional representation including automatically numbering one or more coordinate points.

Example 108 includes the system of any of Examples 101 to 107, wherein the one or more processors are configured to generate the two-dimensional representation including adding an annotative text.

Example 109 includes the system of any of Examples 91 to 108, wherein the automated duct definition interface comprises an assembly selection unit, and wherein the plurality of duct definition parameters comprises one or more assembly selection parameters based at least on user input to the assembly selection unit.

Example 110 includes the system of any of Examples 91 to 109, wherein the automated duct definition interface comprises a duct shape selection unit, and wherein the plurality of duct definition parameters comprises one or more shape selection parameters based at least on user input to the duct shape selection unit.

Example 111 includes the system of Example 110, wherein the duct shape selection unit is configured to allow a user to define a centerline associated with a curved duct.

Example 112 includes the system of any of Examples 91 to 111, wherein the automated duct definition interface comprises a dimension selection unit, and wherein the plurality of duct definition parameters comprises one or more dimension selection parameters based at least on user input to the dimension selection unit.

Example 113 includes the system of any of Examples 91 to 112, wherein the automated duct definition interface comprises a duct pressure selection unit, and wherein the plurality of duct definition parameters comprises one or more pressure selection parameters based at least on user input to the duct pressure selection unit.

Example 114 includes the system of any of Examples 91 to 113, wherein the automated duct definition interface comprises a duct material selection unit, and wherein the plurality of duct definition parameters comprises one or more material selection parameters based at least on user input to the duct material selection unit.

Example 115 includes the system of any of Examples 91 to 114, wherein the automated duct definition interface comprises a duct feature selection unit, and wherein the plurality of duct definition parameters comprises one or more feature selection parameters based at least on user input to the duct feature selection unit.

Example 116 includes the system of Example 115, wherein the duct feature selection unit is configured to allow a user to select from among a plurality of duct end types.

Example 117 includes the system of Example 115 or Example 116, wherein the duct feature selection unit is configured to allow a user to select from among a plurality of couplings.

Example 118 includes the system of any of Examples 115 to 117, wherein the duct feature selection unit is configured to allow a user to select from among a plurality of test port types.

Example 119 includes the system of any of Examples 91 to 118, wherein the automated duct definition interface is configured to automatically limit user choices within the automated duct definition interface based at least on prior user selection within the automated duct definition interface.

Example 120 includes the system of any of Examples 91 to 119, wherein the automated duct definition interface is configured to generate a preview of the duct based at least on a user's selection within the automated duct definition interface.

What is claimed is:

1. A method comprising:

receiving, from an automated duct definition interface, a plurality of duct definition parameters associated with a duct;

in response to the receiving, automatically building a duct definition database based at least on the plurality of duct definition parameters, the duct definition database further comprising a plurality of operational parameters associated with the duct;

subsequent to building the duct definition database, generating a duct model associated with the duct based at least on the duct definition database; and communicating the duct model to a duct modeling application for rendering.

2. The method of claim 1, wherein the plurality of operational parameters comprises one or more material type parameters, one or more manufacturing processing parameters, or one or more shipping parameters.

3. The method of claim 1, wherein the duct model comprises a model-based definition of the duct.

4. The method of claim 1, further comprising:

selecting one or more duct model modules from a plurality of duct model modules, each of the plurality of duct model modules associated with one or more features of the duct; and wherein generating the duct model comprises generating the duct model using the one or more duct model modules.

5. The method of claim 1, wherein the duct model comprises a three-dimensional representation, a two-dimensional representation, or both, and wherein the method further comprises rendering, by the duct modeling application, the duct model.

6. The method of claim 1, wherein generating the duct model comprises generating a three-dimensional representation of the duct and generating, based at least on the three-dimensional representation, a two-dimensional representation of the duct.

7. The method of claim 6, wherein generating the two-dimensional representation comprises analyzing the three-dimensional representation to determine one or more bends in the duct.

8. The method of claim 7, wherein analyzing the three-dimensional representation to determine one or more bends in the duct comprises an iterative bend identification process, the iterative bend identification process comprising:

generating at least three points along a portion of a centerline of the three-dimensional representation;

determining whether the at least three points are colinear;

if the at least three points are not colinear, identifying a location within the three-dimensional representation of the duct where a bend exists; and repeating the iterative bend identification process along a length of the centerline.

9. The method of claim 8, wherein generating the two-dimensional representation of the duct comprises generating a front view of the three-dimensional representation, wherein generating the front view comprises:

determining a first vector extending from a first point proximate a first end of the centerline along a first straight portion of the centerline;

determining a second vector extending from the first point to a second point along the bend; and determining a viewing angle based at least on a cross product of the first vector and the second vector, wherein the front view corresponds to a view of the three- dimensional representation from the viewing angle.

10. The method of claim 9, wherein generating the two-dimensional representation further comprises:

determining a third vector extending along a second straight portion of the centerline on an opposite side of the bend from the first point; and identifying a bend coordinate based on an intersection between the first vector and the third vector.

11. The method of claim 10, wherein generating the two-dimensional representation further comprises adding a dimension annotation indicating a distance between the first point and the bend coordinate.

12. The method of claim 11, wherein generating the two-dimensional representation comprises automatically numbering one or more coordinate points or adding an annotative text.

13. The method of claim 1, wherein the automated duct definition interface comprises one of the following:

an assembly selection unit, and wherein the plurality of duct definition parameters comprises one or more assembly selection parameters based at least on user input to the assembly selection unit;

a duct shape selection unit, and wherein the plurality of duct definition parameters comprises one or more shape selection parameters based at least on user input to the duct shape selection unit;

a dimension selection unit, and wherein the plurality of duct definition parameters comprises one or more dimension selection parameters based at least on user input to the dimension selection unit;

a duct pressure selection unit, and wherein the plurality of duct definition parameters comprises one or more pressure selection parameters based at least on user input to the duct pressure selection unit;

a duct material selection unit, and wherein the plurality of duct definition parameters comprises one or more material selection parameters based at least on user input to the duct material selection unit; or a duct feature selection unit, and wherein the plurality of duct definition parameters comprises one or more feature selection parameters based at least on user input to the duct feature selection unit.

14. The method of claim 1, wherein the automated duct definition interface is configured to allow a user to define a centerline associated with a curved duct.

15. The method of claim 1, wherein the automated duct definition interface is configured to automatically limit user choices within the automated duct definition interface based at least on prior user selection within the automated duct definition interface.

16. The method of claim 1, wherein the automated duct definition interface is configured to generate a preview of the duct based at least on a user's selection within the automated duct definition interface.

17. A non-transient, computer-readable medium storing instructions executable by one or more processors to perform operations that include:

receiving, from an automated duct definition interface, a plurality of duct definition parameters associated with a duct;

in response to the receiving, automatically building a duct definition database based at least on the plurality of duct definition parameters, the duct definition database further comprising a plurality of operational parameters associated with the duct;

subsequent to building the duct definition database, generating a duct model associated with the duct based at least on the duct definition database; and communicating the duct model to a duct modeling application for rendering.

18. The non-transient, computer-readable medium of claim 17, wherein generating the duct model comprises storing one or more of the plurality of operational parameters as metadata of the duct model.

19. A system comprising:

a memory configured to store instructions; and one or more processors configured to:

receive, from an automated duct definition interface, a plurality of duct definition parameters associated with a duct;

in response to the receiving, automatically build a duct definition database based at least on the plurality of duct definition parameters, the duct definition database further comprising a plurality of operational parameters associated with the duct;

subsequent to building the duct definition database, generate a duct model associated with the duct based at least on the duct definition database; and communicate the duct model to a duct modeling application for rendering.

20. The system of claim 19, wherein the automated duct definition interface comprises a duct feature selection unit, and wherein:

the plurality of duct definition parameters comprises one or more feature selection parameters based at least on user input to the duct feature selection unit; and the duct feature selection unit is configured to allow a user to select from among a plurality of duct end types, a plurality of couplings, or a plurality of test port types.

* * * * *